US012593405B2

(12) United States Patent
Bae

(10) Patent No.: US 12,593,405 B2
(45) Date of Patent: Mar. 31, 2026

(54) CIRCUIT BOARD AND SEMICONDUCTOR PACKAGE COMPRISING SAME

(71) Applicant: LG INNOTEK CO., LTD., Seoul (KR)

(72) Inventor: Jae Man Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 181 days.

(21) Appl. No.: 18/681,280

(22) PCT Filed: Aug. 5, 2022

(86) PCT No.: PCT/KR2022/011656
§ 371 (c)(1),
(2) Date: Feb. 5, 2024

(87) PCT Pub. No.: WO2023/014165
PCT Pub. Date: Feb. 9, 2023

(65) Prior Publication Data
US 2024/0373554 A1 Nov. 7, 2024

(30) Foreign Application Priority Data
Aug. 5, 2021 (KR) ........................ 10-2021-0103382

(51) Int. Cl.
*H05K 1/11* (2006.01)
*H01L 23/538* (2006.01)
*H05K 3/46* (2006.01)

(52) U.S. Cl.
CPC .......... *H05K 1/115* (2013.01); *H01L 23/5383* (2013.01); *H01L 23/5386* (2013.01); *H05K 3/4655* (2013.01); *H05K 2201/09854* (2013.01)

(58) Field of Classification Search
CPC ................. H05K 1/115; H05K 3/4655; H05K 2201/09854; H01L 23/5383; H01L 23/5386
(Continued)

(56) References Cited

U.S. PATENT DOCUMENTS 9,520,333 B1 12/2016 Shih et al.
10,186,483 B2 1/2019 Oh
(Continued)

FOREIGN PATENT DOCUMENTS

CN 208298813 U 12/2018
KR 10-2010-0020718 A 2/2010
(Continued)

OTHER PUBLICATIONS

Office Action dated May 29, 2025 in Korean Application No. 10-2021-0103382.
(Continued)

*Primary Examiner* — Andargie M Aychillhum
(74) *Attorney, Agent, or Firm* — Saliwanchik, Lloyd & Eisenschenk

(57) ABSTRACT

A circuit board according to an embodiment includes an insulating layer including an upper and lower surface; and a through electrode passing through the upper and lower surfaces of the insulating layer and having a first inclination whose width gradually decreases toward the lower surface of the insulating layer, and wherein the through electrode includes a void portion having an inclination different from the first inclination.

20 Claims, 16 Drawing Sheets

(58) Field of Classification Search
USPC ........................................................ 174/255
See application file for complete search history.

(56) References Cited

U.S. PATENT DOCUMENTS

| | | | |
|---|---|---|---|
| 2010/0038778 A1 | 2/2010 | Lee et al. | |
| 2014/0353027 A1* | 12/2014 | Osaki ..................... | H05K 3/427 |
| | | | 174/266 |
| 2015/0016082 A1* | 1/2015 | Lee ....................... | H01L 25/105 |
| | | | 174/262 |
| 2016/0372395 A1 | 12/2016 | Shih et al. | |

FOREIGN PATENT DOCUMENTS

| | | | |
|---|---|---|---|
| KR | 10-2010-0111459 A | 10/2010 | |
| KR | 10-2011-0034427 A | 4/2011 | |
| KR | 10-2012-0072637 A | 7/2012 | |
| KR | 10-2014-0135007 A | 11/2014 | |
| KR | 10-2018-0031283 A | 3/2018 | |

OTHER PUBLICATIONS

International Search Report dated Nov. 29, 2022 in International Application No. PCT/KR2022/011656.

* cited by examiner

CIRCUIT BOARD AND SEMICONDUCTOR PACKAGE COMPRISING SAME

CROSS-REFERENCE TO RELATED APPLICATIONS

This application is the U.S. national stage application of International Patent Application No. PCT/KR2022/011656, filed Aug. 5, 2022, which claims the benefit under 35 U.S.C. § 119 of Korean Application No. 10-2021-0103382, filed Aug. 5, 2021, the disclosures of each of which are incorporated herein by reference in their entirety.

TECHNICAL FIELD

The embodiment relates to a circuit board and a semiconductor package comprising the same.

BACKGROUND ART

As miniaturization, weight reduction, and integration of an electronic component are accelerated, a line width of a circuit has been miniaturized. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of inhibiting loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, the circuit board includes a through electrode for interlayer conduction. The through electrode may be formed by filling a conductive material into a through hole penetrating the insulating layer of the circuit board. The through electrode performs various functions, for example, signal transmission, heat dissipation, and shielding functions.

In addition, the circuit board includes a pad part disposed on an upper surface of the insulating layer and connected to the through electrode. At this time, the pad part is formed together with the through electrode in a process of filling the through hole.

Meanwhile, recently, a thickness of the insulating layer has been increasing to improve the thermal shock and heat dissipation characteristics of the circuit board. At this time, as the thickness of the insulating layer increases, the depth of the through hole becomes deeper, and accordingly, when the through hole is filled, an upper surface of the pad part has a concave shape in a direction toward the through electrode.

In addition, when the upper surface of the pad part has a concave shape, a flatness of the circuit board is reduced, which may cause various reliability problems.

For example, a circuit board has a multi-layer laminated structure. At this time, when the upper surface of the pad part has a concave shape, the surface of the insulating layer or circuit pattern layer additionally laminated on the pad part also has a concave shape, and an overall flatness of the circuit board may be reduced accordingly. In addition, when the flatness of the circuit board decreases, a problem occurs in which the position of the through hole is distorted when forming the through hole, and thus the alignment between the through electrode and the pad part is reduced.

DISCLOSURE

Technical Problem

The embodiment provides a circuit board with a new structure and a semiconductor package including the same.

Additionally, the embodiment provides a circuit board including a through electrode with a void and a semiconductor package including the same.

Additionally, the embodiment provides a circuit board capable of improving the flatness of a pad part and a semiconductor package including the same.

Additionally, the embodiment provides a circuit board with improved elasticity and resistance to thermal shock, and a semiconductor package including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises an insulating layer including an upper and lower surface; and a through electrode passing through the upper and lower surfaces of the insulating layer and having a first inclination whose width gradually decreases toward the lower surface of the insulating layer, and wherein the through electrode includes a void portion having an inclination different from the first inclination.

In addition, a vertical cross sectional shape of the void portion has a diamond shape.

In addition, the void portion includes a first region adjacent to a lower surface of the through electrode and having a second inclination whose width gradually increases toward an upper surface of the through electrode; and a second region adjacent to the upper surface of the through electrode and having a third inclination whose width gradually decreases toward the upper surface of the through electrode.

In addition, a vertical distance of the second region of the void portion is greater than a vertical distance of the first region of the void portion.

In addition, the second inclination of the first region of the void portion and the first inclination of the through electrode are inclined in a same direction.

In addition, the third inclination of the second region of the void portion and the first inclination of the through electrode are inclined in different directions.

In addition, a vertical distance from a lowermost end of the first region of the void portion to an uppermost end of the second region satisfies a range of 20% to 80% of a thickness of the through electrode.

In addition, a width in a widest region of the void portion satisfies a range of 30% to 80% of a width of a lower surface of the through electrode.

In addition, the first region of the void portion includes a first side surface in a vertical cross-section in a vertical direction toward the upper and lower surfaces of the through electrode, wherein the second region of the void portion includes a second side surface connected to the first side surface in a vertical cross-section, wherein the second inclination is a straight inclination connecting one end and the other end of the first side, and wherein the third inclination is a straight inclination connecting one end and the other end of the second side.

In addition, at least one of the first side surface and the second side surface has a straight line shape having the second inclination or the third inclination.

In addition, at least one of the first side surface and the second side surface includes a curved surface having a certain curvature in a thickness direction of the void portion, and wherein the curved surface includes at least one of a curved surface that is convex toward an outside of the void portion and a curved surface that is concave toward an inside of the void portion.

In addition, at least one of the first side surface and the second side surface has a first shape of any one of a straight line having the second inclination or the third inclination, a curved surface convex toward the outside of the void portion, and a curved surfaces concave in the inner direction of the void portion in a first vertical cross section of the void portion, and has a second shape different from the first shape among a straight line having the second inclination or the third inclination, a curved surface convex toward the outside of the void portion, and a curved surface concave toward the inner direction of the void portion in a second vertical cross section different from the first vertical cross section.

Additionally, a vertical cross-sectional shape of the void portion has a triangular shape.

Additionally, the void portion has a third inclination whose width gradually decreases toward the upper surface of the through electrode.

Additionally, the third inclination of the void portion and the first inclination of the through electrode are inclined in different directions.

Additionally, the circuit board further comprises a first circuit pattern layer including a first pad part disposed on the upper surface of the insulating layer and connected to an upper surface of the through electrode; and a second circuit pattern layer including a second pad part disposed on the lower surface of the insulating layer and connected to a lower surface of the through electrode, and wherein an upper surface of the first pad part is flat.

Meanwhile, the semiconductor package according to the embodiment comprises an insulating layer including an upper and lower surface; a through electrode passing through the upper and lower surfaces of the insulating layer and having a first inclination whose width gradually decreases toward the lower surface of the insulating layer; a first circuit pattern layer including a first pad part disposed on the upper surface of the insulating layer and connected to an upper surface of the through electrode; a second circuit pattern layer disposed on a lower surface of the insulating layer and including a second pad part connected to a lower surface of the through electrode; a connection part disposed on the first pad part; a chip disposed on the connection part; and a molding layer for molding the chip, wherein the through electrode includes at least one of a first void portion having a first shape and a second void portion having a second shape different from the first shape, and wherein a vertical cross section of the first void portion has a rhombus shape including a first region adjacent to the lower surface of the through electrode and having a second inclination that gradually increases in width toward the upper surface of the through electrode and is inclined in the same direction as the first inclination, and a second region adjacent to the upper surface of the through electrode, the width of which gradually decreases toward the upper surface of the through electrode, and having a third inclination inclined in a direction different from the first inclination and the second inclination, and wherein a vertical cross section of the second void portion has a triangular shape whose width gradually decreases toward the upper surface of the through electrode and includes a region having a third inclination inclined in a different direction from the first inclination.

Advantageous Effects

The circuit board of the embodiment includes an insulating layer and a through electrode passing through the insulating layer. At this time, the through electrode includes a void portion, which is an empty space not filled with a conductive material. Additionally, the embodiment includes a first pad part disposed on the upper surface of the through electrode. At this time, a thickness of the through electrode may exceed 80 um, and the upper surface of the first pad part may be a flat surface that does not include a concave portion. That is, in the comparative example, a thickness of the through electrode is above a certain level, and accordingly, a concave portion concave downward is provided at an upper surface of the first pad part. In contrast, the embodiment includes a void portion in the through electrode, thereby eliminating the concave portion formed at the first pad part. Accordingly, the embodiment can maintain the flatness of the circuit board and thereby improve the electrical reliability and physical reliability of the circuit board. Additionally, the embodiment can omit an additional plating process and polishing process performed to remove the concave portion, thereby simplifying a process of manufacturing.

Meanwhile, the void portion within the through electrode of the embodiment may include a first region having a second inclination different from the first inclination of the through electrode. At this time, the second inclination may be different from the first inclination only in an angle of inclination, but a direction of inclination may be the same. In addition, the embodiment allows improving the elasticity of the through electrode and the elasticity of the circuit board through the first region of the void portion having the second inclination in the same inclined direction as the first inclination, as a result, the embodiment can absorb damage from thermal shock. Accordingly, the embodiment can inhibit cracks that may occur due to damage that may occur in various usage environments, and thus improve the physical reliability of the circuit board.

Additionally, the void portion of the through electrode of the embodiment may include a second region having a third inclination different from the first inclination of the through electrode. At this time, the third inclination may be different from the first inclination in not only an angle of inclination but also a direction of inclination. In addition, the embodiment allows to improve the strength of the through electrode by using the second region of the void portion having a third inclination having a in inclination direction different from the first inclination, furthermore, the strength of the circuit board can be improved, and through this, warpage characteristics can be improved. That is, the inclined direction of the second region of the void portion with the third inclination is different from the inclined direction of the first inclination of the through electrode, and accordingly, it can function to support the through electrode, thereby improving the strength of the through electrode and the circuit board.

DESCRIPTION OF DRAWINGS

FIG. 4E is a view showing a through electrode according to a fourth embodiment.

FIG. 4F is a view showing a through electrode according to a fifth embodiment.

BEST MODE

Hereinafter, embodiments of the present disclosure will be described in detail with reference to the accompanying drawings.

However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art. In addition, the terms used in the embodiments of the present disclosure are for describing the embodiments and are not intended to limit the present disclosure.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present disclosure, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Comparative Example (Structure and Problems of Prior Art)

Figures 1, 2A:
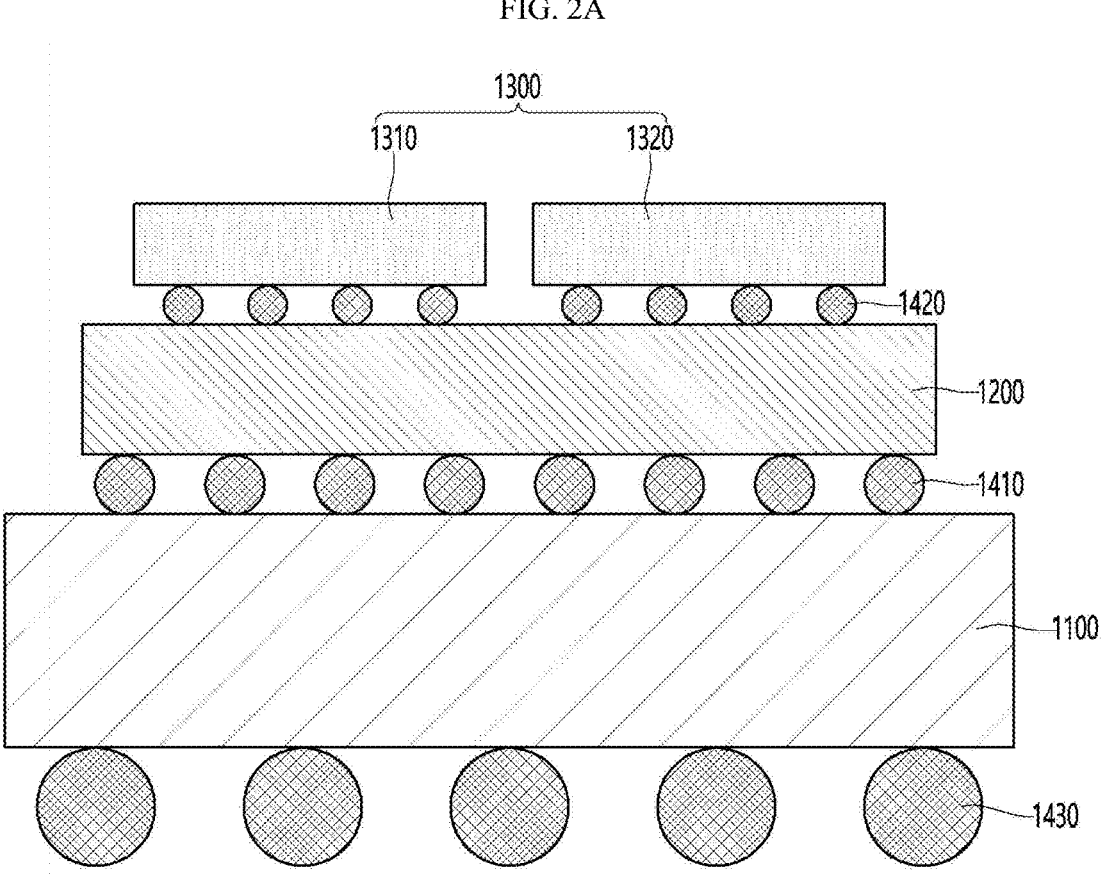
FIG. 1 is a view showing a circuit board of a comparative example.
FIG. 2A is a cross-sectional view illustrating a semiconductor package according to a first embodiment.

FIG. 1 is a view showing a circuit board according to a comparative example.

Referring to FIG. 1, the circuit board of the comparative example includes an insulating layer 10, a first circuit pattern layer 20, a second circuit pattern layer 30, and a through electrode 40.

Before explaining comparative examples, the circuit board is required to have higher densities as electronic devices become more functional and semiconductor devices become more integrated. Accordingly, the circuit board has a multi-layer structure.

Product groups to which this multi-layer circuit board is applied include FCBGA (Flip Chip Ball Grid Array) and FCCSP (Flip Chip Chip Scale Package). Additionally, the circuit board applied to FCBGA or FCCSP may include an insulating layer.

At this time, the insulating layer has a thickness above a certain level to improve thermal shock or heat dissipation characteristics. For example, the insulating layer has a thickness of 80 um or more to implement a multi-layer build-up.

That is, the insulating layer 10 may include glass fiber to ensure the rigidity of the circuit board. For example, the insulating layer 10 may include a prepreg containing resin and glass fibers dispersed within the resin.

Additionally, a first circuit pattern layer 20 is disposed on the lower surface of the insulating layer 10. Additionally, a second circuit pattern layer 30 is disposed on the upper surface of the insulating layer 20.

In addition, a through electrode 40 is formed in the insulating layer 10, which passes through the insulating layer 10 and is connected to the first circuit pattern layer 20 and the second circuit pattern layer 30.

The through electrode 40 can be formed by filling a through hole penetrating the insulating layer 10 with a conductive material.

That is, in the comparative example, the insulating layer 10 is processed with a laser to form the through hole. And, in the comparative example, the through electrode 40 is formed by filling the through hole with a conductive material.

At this time, when the through hole is filled with a conductive material to form the through electrode 40, a second circuit pattern layer 30 connected to the through electrode 40 is also formed.

However, as described above, the thickness of the insulating layer 10 is increasing, and accordingly, a depth of the through hole is also becoming deeper, and there is a problem of dimples occurring on the surface when forming the second circuit pattern layer 30.

For example, the second circuit pattern layer 30 includes a pad part 30D that vertically overlaps the through electrode 40. At this time, the pad part 30D may be formed together with the through electrode 40 when filling the through hole. At this time, as the depth of the through hole increases, an amount of conductive material filled in the through hole also increases. Accordingly, an upper surface of the pad part 30D that vertically overlaps the through electrode 40 has a concave shape in a direction toward the through electrode 40. In addition, when the upper surface of the pad part 30D has a concave shape, an overall flatness of the circuit board is reduced, which may cause various reliability problems.

For example, a circuit board has a multi-layer laminated structure. At this time, if the upper surface of the pad part 30D has a concave shape, the surface of the insulating layer or circuit pattern layer additionally laminated on the pad part (30D) also has a concave shape, resulting in the overall flatness of the circuit board. degree may decrease. In addition, when the flatness of the circuit board decreases and a through hole is formed in an additionally laminated insulating layer, a problem such as the position of the through hole being misaligned occurs, and as a result, there is a problem in that the alignment between the through electrode and the pad part is reduced.

Accordingly, the embodiment makes it possible to remove a concave portion on a surface of the pad part that occurs in a process of forming the through electrode and the pad part.

Furthermore, the embodiment provides a circuit board that is resistant to thermal shock by improving the elasticity of a circuit board including an insulating layer having a certain thickness or more, and a semiconductor package including the same.

—Electronic Device—

Before describing the embodiment, an electronic device to which the semiconductor package of the embodiment is applied will be briefly described. The electronic device includes a main board (not shown). The main board may be physically and/or electrically connected to various components. For example, the main board may be connected to the semiconductor package of the embodiment. Various semiconductor devices may be mounted on the semiconductor package.

The semiconductor device may include an active device and/or a passive device. The active device may be a semiconductor chip in the form of an integrated circuit (IC) in which hundreds to millions of devices are integrated in one chip. The semiconductor device may be a logic chip, a memory chip, or the like. The logic chip may be a central processor (CPU), a graphics processor (GPU), or the like. For example, the logic chip may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far.

The memory chip may be a stack memory such as HBM. The memory chip may also include a memory chip such as volatile memory (e.g., DRAM), non-volatile memory (e.g., ROM), flash memory, and the like.

On the other hand, a product group to which the semiconductor package of the embodiment is applied may be any one of CSP (Chip Scale Package), FC-CSP (Flip Chip-Chip Scale Package), FC-BGA (Flip Chip Ball Grid Array), POP (Package on Package) and SIP (System in Package), but is not limited thereto.

In addition, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Hereinafter, a semiconductor package including a circuit board according to an embodiment will be described. The semiconductor package of the embodiment may have various package structures including a circuit board to be described later. In addition, the circuit board in one embodiment may be a package substrate described below, and the circuit board in another embodiment may be an interposer described below.

Figure 2B:
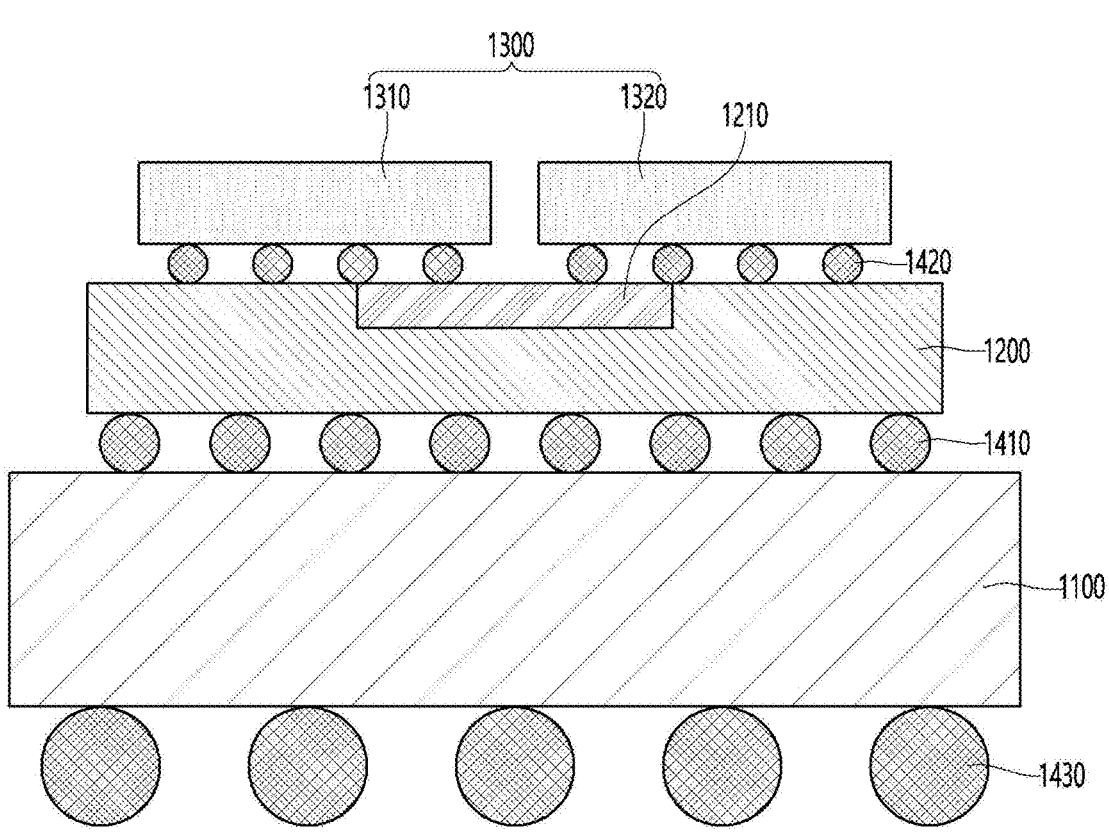
FIG. 2B is a cross-sectional view illustrating a semiconductor package according to a second embodiment.
Figure 2C:
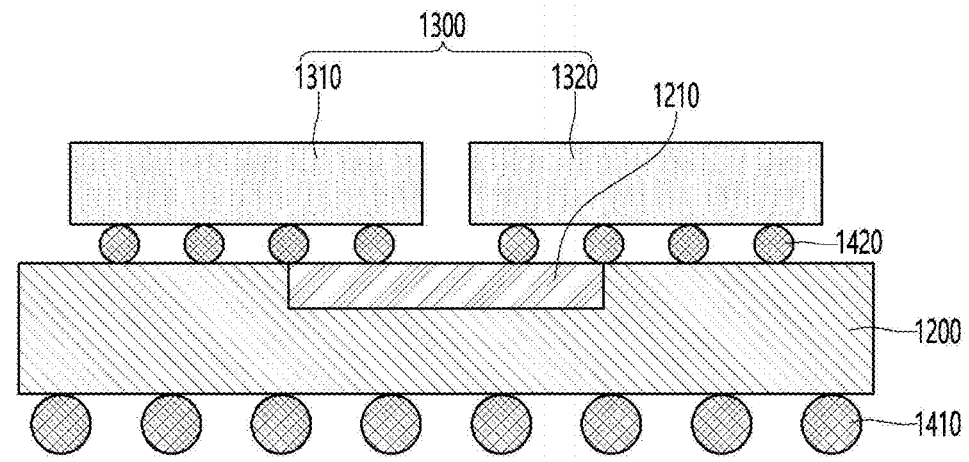
FIG. 2C is a cross-sectional view illustrating a semiconductor package according to a third embodiment.
Figure 2D:
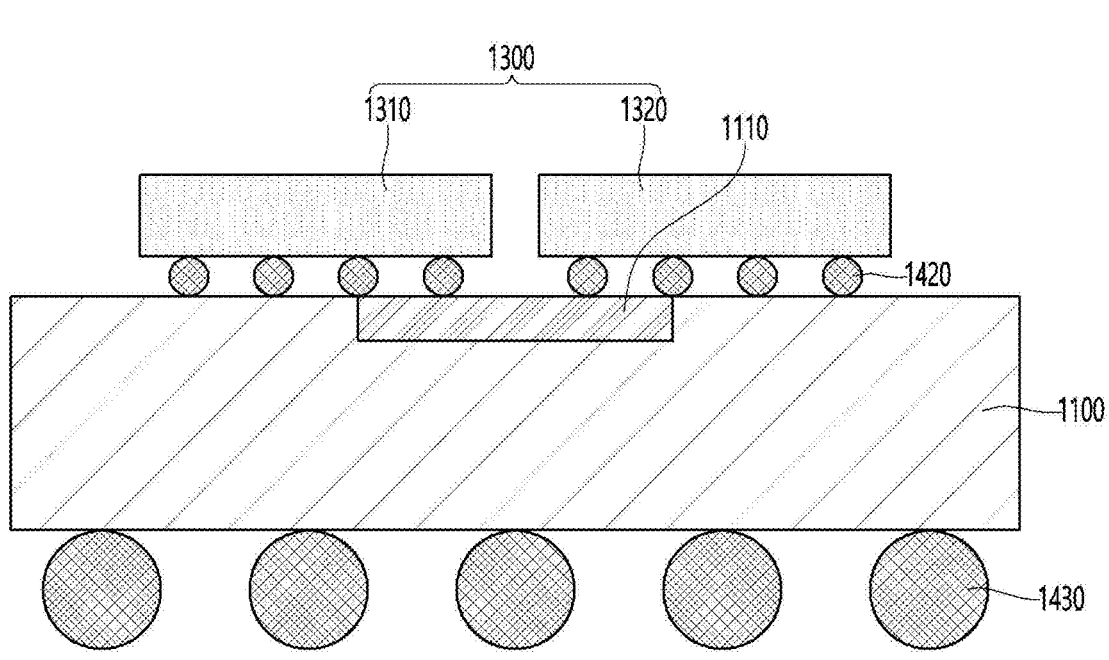
FIG. 2D is a cross-sectional view illustrating a semiconductor package according to a fourth embodiment.
Figure 2E:
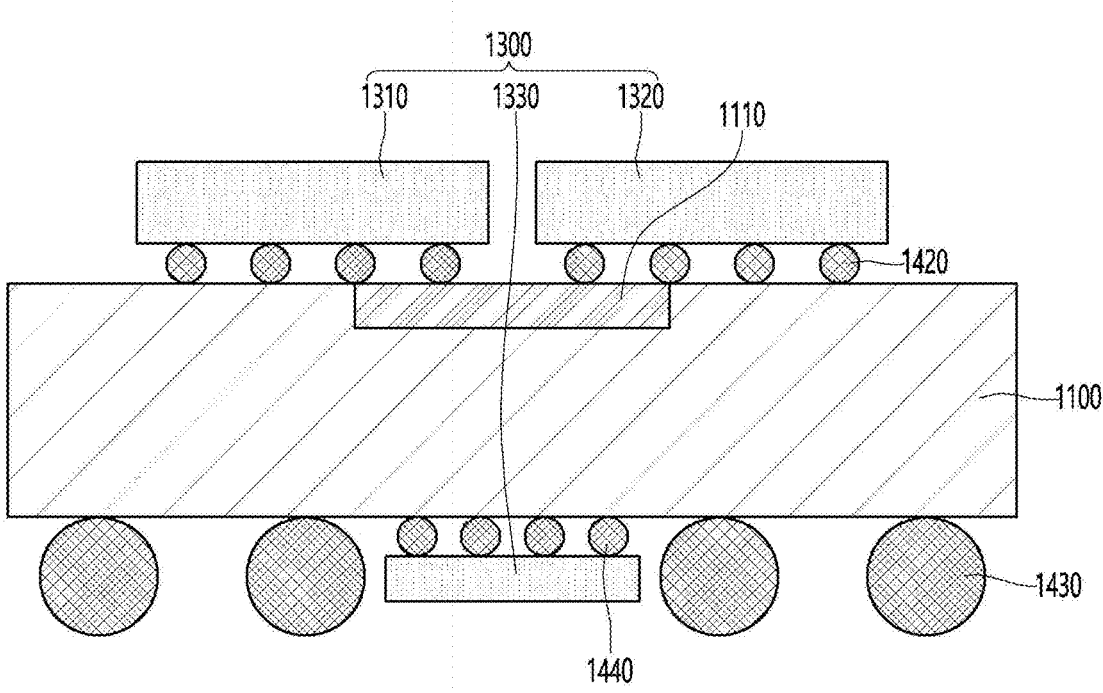
FIG. 2E is a cross-sectional view illustrating a semiconductor package according to a fifth embodiment.
Figures 2F, 2G:
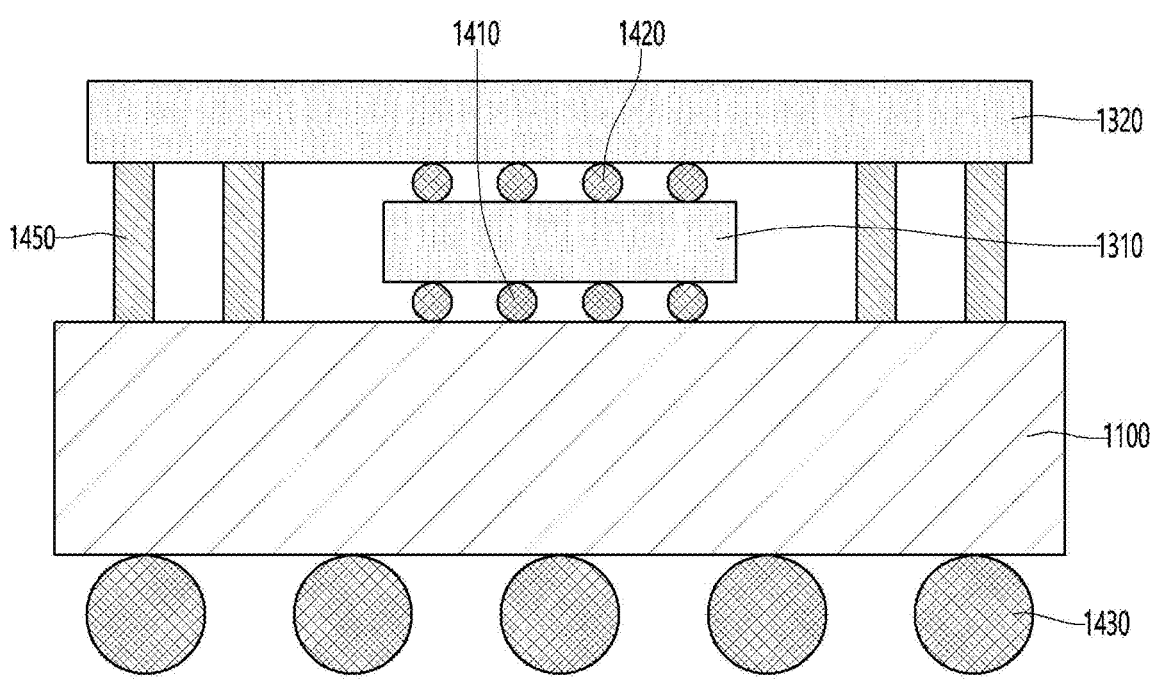
FIG. 2F is a cross-sectional view illustrating a semiconductor package according to a sixth embodiment.
FIG. 2G is a cross-sectional view illustrating a semiconductor package according to a seventh embodiment.

FIG. 2A is a cross-sectional view illustrating a semiconductor package according to a first embodiment, FIG. 2B is a cross-sectional view illustrating a semiconductor package according to a second embodiment, FIG. 2C is a cross-sectional view illustrating a semiconductor package according to a third embodiment, FIG. 2D is a cross-sectional view illustrating a semiconductor package according to a fourth embodiment, FIG. 2E is a cross-sectional view illustrating a semiconductor package according to a fifth embodiment, FIG. 2F is a cross-sectional view illustrating a semiconductor package according to a sixth embodiment, and FIG. 2G is a cross-sectional view illustrating a semiconductor package according to a seventh embodiment.

Referring to FIG. 2A, the semiconductor package according to the first embodiment may include a first circuit board 1100, a second circuit board 1200, and a semiconductor device 1300.

The first circuit board 1100 means a package substrate.

For example, the first circuit board 1100 may provide a space to which at least one external substrate is coupled. The external substrate may refer to a second circuit board 1200 coupled to the first circuit board 1100. Also, the external substrate may refer to a main board included in an electronic device coupled to a lower portion of the first circuit board 1100.

Also, although not shown in the drawing, the first circuit board 1100 may provide a space in which at least one semiconductor device is mounted.

The first circuit board 1100 includes at least one insulating layer, an electrode disposed on the at least one insulating layer, and a through portion passing through the at least one insulating layer.

A second circuit board 1200 is disposed on the first circuit board 1100.

The second circuit board 1200 may be an interposer. For example, the second circuit board 1200 may provide a space in which at least one semiconductor device is mounted. The second circuit board 1200 may be connected to the at least one semiconductor device 1300. For example, the second circuit board 1200 may provide a space in which the first semiconductor device 1310 and the second semiconductor device 1320 are mounted. The second circuit board 1200 may electrically connect the first and second semiconductor devices 1310 and 1320 and the first circuit board 1100 while electrically connecting the first semiconductor device 1310 and the second semiconductor device 1320. That is, the second circuit board 1200 may perform a horizontal connection function between a plurality of semiconductor devices and a vertical connection function between the semiconductor devices and the package substrate.

FIGS. 2A-2G illustrate that the first and second semiconductor devices 1310 and 1320 are disposed on the second circuit board 1200, but is not limited thereto. For example, one semiconductor device may be disposed on the second circuit board 1200, or alternatively, three or more semiconductor devices may be disposed.

The second circuit board 1200 may be disposed between the semiconductor device 1300 and the first circuit board 1100.

In an embodiment, the second circuit board 1200 may be an active interposer that functions as a semiconductor device. When the second circuit board 1200 functions as a semiconductor device, the package of the embodiment may have a structure in which a plurality of logic chips are mounted on the first circuit board 1100 in a vertically stacked structure. In addition, a first logic chip corresponding to the active interposer among the logic chips may perform a signal transfer function between the second logic chip disposed thereon and the first circuit board 1100 while functioning as a corresponding logic chip.

According to another embodiment, the second circuit board 1200 may be a passive interposer. For example, the second circuit board 1200 may function as a signal relay between the semiconductor device 1300 and the first circuit board 1100. For example, a number of terminals of the semiconductor device 1300 is gradually increasing due to 5G, Internet of Things (IOT), increased image quality, and increased communication speed. That is, the number of terminals provided in the semiconductor device 1300 increases, thereby reducing the width of the terminals or an interval between the plurality of terminals. In this case, the first circuit board 1100 is connected to the main board of the electronic device. There is a problem in that the thickness of the first circuit board 1100 increases or the layer structure of the first circuit board 1100 becomes complicated in order for the electrodes provided on the first circuit board 1100 to have a width and an interval to be respectively connected to the semiconductor device 1300 and the main board. Accordingly, in the first embodiment, the second circuit board 1200 is disposed on the first circuit board 1100 and the semiconductor device 1300. In addition, the second circuit board 1200 may include electrodes having a fine width and an interval corresponding to the terminals of the semiconductor device 1300.

the semiconductor device 1300 may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far. The memory chip may be a stack memory such as HBM. The memory chip may also include a memory chip such as volatile memory (e.g., DRAM), non-volatile memory (e.g., ROM), flash memory, and the like.

Meanwhile, the semiconductor package of the first embodiment may include a connection part.

For example, the semiconductor package includes a first connection part 1410 disposed between the first circuit board 1100 and the second circuit board 1200. The first connection part 1410 electrically connects the second circuit board 1200 to the first circuit board 1100 while coupling them.

For example, the semiconductor package may include the second connection part 1420 disposed between the second circuit board 1200 and the semiconductor device 1300. The second connection part 1420 may electrically connect the semiconductor device 1300 to the second circuit board 1200 while coupling them.

The semiconductor package includes a third connection part 1430 disposed on a lower surface of the first circuit board 1100. The third connection part 1430 may electrically connect the first circuit board 1100 to the main board while coupling them.

At this time, the first connection part 1410, the second connection part 1420, and the third connection part 1430 may electrically connect between the plurality of components by using at least one bonding method of wire bonding, solder bonding and metal-to-metal direct bonding.

That is, since the first connection part 1410, the second connection part 1420, and the third connection part 1430 have a function of electrically connecting a plurality of components, when the metal-to-metal direct bonding is used, the connection part of the semiconductor package may be understood as an electrically connected portion, not a solder or wire.

The wire bonding method may refer to electrically connecting a plurality of components using a conductive wire such as gold (Au). Also, the solder bonding method may electrically connect a plurality of components using a material containing at least one of Sn, Ag, and Cu. In addition, the metal-to-metal direct bonding method may refer to recrystallization by applying heat and pressure between a plurality of components without the presence of solder, wire, conductive adhesive, etc. and to directly bond between the plurality of components. In addition, the metal-to-metal direct bonding method may refer to a bonding method by the second connection part 1420. In this case, the second connection part 1420 may mean a metal layer formed between a plurality of components by the recrystallization.

Specifically, the first connection part 1410, the second connection part 1420, and the third connection part 1430 may couple a plurality of components to each other by a thermal compression (TC) bonding method. The TC bonding may refer to a method of directly coupling a plurality of components by applying heat and pressure to the first connection part 1410, the second connection part 1420, and the third connection part 1430.

In this case, at least one of the first circuit board 1100 and the second circuit board 1200 may include a protrusion provided in the electrode on the first connection part 1410, the second connection part 1420, and the third connection part 1430 are disposed. The protrusion may protrude outward from the first circuit board 1100 or the second circuit board 1200.

The protrusion may be referred to as a bump. The protrusion may also be referred to as a post. The protrusion may also be referred to as a pillar. Preferably, the protrusion may refer to an electrode on which a second connection part 1420 for coupling with the semiconductor device 1300 is disposed among the electrodes of the second circuit board 1200. That is, as a pitch of the terminals of the semiconductor device 1300 is reduced, a short circuit may occur in the second connection parts 1420 respectively connected to the terminals of the semiconductor device 1300. Accordingly, in the embodiment, the protrusion is included in the electrode of the second circuit board 1200 on which the second connection part 1420 is disposed in order to reduce a volume of the second connection part 1420. The protrusion may improve matching between the electrode of the second circuit board 1200 and the terminal of the semiconductor device 1300 and inhibit diffusion of the second connection part 1420.

Meanwhile, referring to FIG. 2B, the semiconductor package of the second embodiment is different from the semiconductor package of the first embodiment in that the connecting member 1210 is disposed on the second circuit board 1200. The connecting member 1210 may be referred to as a bridge substrate. For example, the connecting member 1210 may include a redistribution layer.

In an embodiment, the connecting member 1210 may be a silicon bridge. That is, the connecting member 1210 may include a silicon substrate and a redistribution layer disposed on the silicon substrate.

In another embodiment, the connecting member 1210 may be an organic bridge. For example, the connecting member 1210 may include an organic material. For example, the connecting member 1210 includes an organic substrate including an organic material instead of the silicon substrate.

The connecting member 1210 may be embedded in the second circuit board 1200, but is not limited thereto. For example, the connecting member 1210 may be disposed on the second circuit board 1200 to have a protruding structure.

Also, the second circuit board 1200 may include a cavity, and the connecting member 1210 may be disposed in the cavity of the second circuit board 1200.

The connecting member 1210 may horizontally connect a plurality of semiconductor devices disposed on the second circuit board 1200.

Referring to FIG. 2C, the semiconductor package according to the third embodiment includes a second circuit board 1200 and a semiconductor device 1300. In this case, the semiconductor package of the third embodiment has a structure in which the first circuit board 1100 is removed compared to the semiconductor package of the second embodiment.

That is, the second circuit board 1200 of the third embodiment may function as a package substrate while performing an interposer function.

The first connection part 1410 disposed on the lower surface of the second circuit board 1200 may couple the second circuit board 1200 to the main board of the electronic device.

Referring to FIG. 2D, the semiconductor package according to the fourth embodiment includes a first circuit board 1100 and a semiconductor device 1300.

In this case, the semiconductor package of the fourth embodiment has a structure in which the second circuit board 1200 is removed compared to the semiconductor package of the second embodiment.

That is, the first circuit board 1100 of the fourth embodiment may function as an interposer connecting the semiconductor device 1300 and the main board while functioning as a package substrate. To this end, the first circuit board 1100 may include a connecting member 1110 for connecting the plurality of semiconductor devices. The connecting member 1110 may be a silicon bridge or an organic material bridge connecting a plurality of semiconductor devices.

Referring to FIG. 2E, the semiconductor package of the fifth embodiment further includes a third semiconductor device 1330 compared to the semiconductor package of the fourth embodiment.

To this end, a fourth connection part 1440 is disposed on the lower surface of the first circuit board 1100.

In addition, a third semiconductor device 1330 may be disposed on the fourth connection part 1400. That is, the semiconductor package of the fifth embodiment may have a structure in which semiconductor devices are mounted on upper and lower sides, respectively.

In this case, the third semiconductor device 1330 may have a structure disposed on the lower surface of the second circuit board 1200 in the semiconductor package of FIG. 2C.

Referring to FIG. 2F, the semiconductor package according to the sixth embodiment includes a first circuit board 1100.

A first semiconductor device 1310 may be disposed on the first circuit board 1100. To this end, a first connection part 1410 is disposed between the first circuit board 1100 and the first semiconductor device 1310.

In addition, the first circuit board 1100 includes a conductive coupling portion 1450. The conductive coupling portion 1450 may further protrude from the first circuit board 1100 toward the second semiconductor device 1320. The conductive coupling portion 1450 may be referred to as a bump or, alternatively, may also be referred to as a post. The conductive coupling portion 1450 may be disposed to have a protruding structure on an electrode disposed on an uppermost side of the first circuit board 1100.

A second semiconductor device 1320 is disposed on the conductive coupling portion 1450 of the first circuit board 1100. In this case, the second semiconductor device 1320 may be connected to the first circuit board 1100 through the conductive coupling portion 1450. In addition, a second connection part 1420 may be disposed on the first semiconductor device 1310 and the second semiconductor device 1320.

Accordingly, the second semiconductor device 1320 may be electrically connected to the first semiconductor device 1310 through the second connection part 1420.

That is, the second semiconductor device 1320 is connected to the first circuit board 1100 through the conductive coupling portion 1450, and is also connected to the first semiconductor device 1310 through the second connection part 1420.

In this case, the second semiconductor device 1320 may receive a power signal through the conductive coupling portion 1450. Also, the second semiconductor device 1320 may transmit and receive a communication signal to and from the first semiconductor device 1310 through the second connection part 1420.

The semiconductor package according to the sixth embodiment provides a power signal to the second semiconductor device 1320 through the conductive coupling portion 1450, thereby providing sufficient power for driving the second semiconductor device 1320. Accordingly, the embodiment may improve the driving characteristics of the second semiconductor device 1320. That is, the embodiment may solve the problem of insufficient power provided to the second semiconductor device 1320. Furthermore, in the embodiment, the power signal and the communication signal of the second semiconductor device 1320 are provided through different paths through the conductive coupling portion 1450 and the second connection part 1420. Through this, the embodiment can solve the problem that the communication signal is lost due to the power signal. For example, the embodiment may minimize mutual interference between communication signals of power signals. Meanwhile, the second semiconductor device 1320 according to the sixth embodiment may have a POP structure and be disposed on the first circuit board 1100. For example, the second semiconductor device 1320 may be a memory package including a memory chip. In addition, the memory package may be coupled on the conductive coupling portion 1450. In this case, the memory package may not be connected to the first semiconductor device 1310.

Referring to FIG. 2G, the semiconductor package according to the seventh embodiment includes a first circuit board 1100, a first connection part 1410, a first connection part 1410, a semiconductor device 1300, and a third connection part 1430.

In this case, the semiconductor package of the seventh embodiment is different from the semiconductor package of the fourth embodiment in that the first circuit board 1100 includes a plurality of substrate layers while the connecting member 1110 is removed.

The first circuit board 1100 includes a plurality of substrate layers. For example, the first circuit board 1100 may include a first substrate layer 1100A corresponding to a package substrate and a second substrate layer 1100B corresponding to a redistribution layer of the connecting member.

That is, in the first circuit board 1100, a second substrate layer 1100B corresponding to a redistribution layer is disposed on the first substrate layer 1100A.

In other words, the semiconductor package of the seventh embodiment includes the first substrate layer 1100A and the second substrate layer 1100B integrally formed. The material of the insulating layer of the second substrate layer 1100B may be different from the material of the insulating layer of the first substrate layer 1100A. For example, the material of the insulating layer of the second substrate layer 1100B may include a photocurable material. For example, the second substrate layer 1100B may be a photo imageable dielectric (PID). In addition, since the second substrate layer 1100B includes a photocurable material, it is possible to miniaturize the electrode. Accordingly, in the seventh embodiment, the second substrate layer 1100B may be formed by sequentially stacking an insulating layer of a photo-curable material on the first substrate layer 1100A and forming a miniaturized electrode on the insulating layer of the photo-curable material. Through this, the second substrate 1100B may be a redistribution layer including a miniaturized electrode.

Hereinafter, the circuit board of the embodiment will be described.

Before describing the circuit board of the embodiment, the circuit board described below may mean any one of a plurality of circuit boards included in the previous semiconductor package.

For example, in an embodiment, a circuit board described below may refer to the first circuit board 1100, the second circuit board 1200, and the connecting member (or bridge substrate, 1110 and 1210) shown in any one of FIGS. 2A to 2G.

—Circuit Board—

Figure 3:
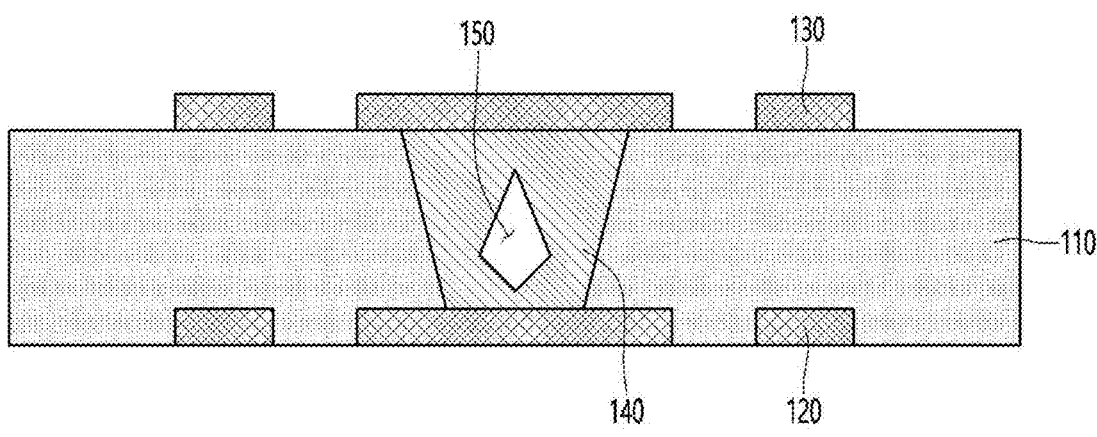
FIG. 3 is a view showing a circuit board according to an embodiment.

FIG. 3 is a view showing a circuit board according to an embodiment.

Referring to FIG. 3, the circuit board includes an insulating layer 110, a first circuit pattern layer 130, a second circuit pattern layer 120, and a through electrode 140.

At this time, in the embodiment, the through electrode 140 includes a void portion 150. For example, the void portion 150 may mean an empty region or space within the through electrode 140 that is not filled with a conductive material. In the embodiment, in a process of filling the through hole penetrating the insulating layer 10 with a conductive material, a portion of the through hole is not filled with the conductive material, so that the through electrode 140 includes a void portion 150, which is a space not filled with the conductive material. In addition, the embodiment allows the void portion 150 included in the through electrode 140 to improve the overall elasticity of the circuit board. Furthermore, the embodiment includes a void portion 150 in the through electrode 140, so that it is possible to resolve dimples in the pad part of the first circuit pattern layer 130 that occur in a process of filling the through hole.

The circuit board of the embodiment may have a single-layer structure or, alternatively, may have a multi-layer structure. For example, the circuit board of the embodiment may have a one-layer structure based on the number of insulating layers, or alternatively, may have a two-layer or more structure.

In FIG. 3, the circuit board is shown as having a one-layer structure based on the number of insulating layer layers, but the circuit board is not limited to this. For example, the circuit board may have a multi-layer structure of two or more layers based on the number of layers of the insulating layer. In this case, the insulating layer in FIGS. 2A-2G may represent one of the insulating layers of the multilayer structure.

The circuit board may include an insulating layer 110. The insulating layer 110 may have a thickness of a certain level or more in order to improve the thermal characteristics, warpage characteristics, and heat dissipation characteristics of the circuit board. For example, the insulating layer 110 may have a thickness ranging from 80 um to 500 um. For example, the insulating layer 110 may have a thickness ranging from 90 um to 450 um. For example, the insulating layer 110 may have a thickness ranging from 100 um to 400 um. If the thickness of the insulating layer 110 is less than 80 um, the overall thermal characteristics, warpage characteristics, and heat dissipation characteristics of the circuit board may be deteriorated. If the thickness of the insulating layer 110 exceeds 500 um, the overall thickness of the circuit board may increase.

Meanwhile, a structure of the circuit board of the embodiment of the present invention described below can be applied to a slim board with an insulating layer thickness of less than 80 um. However, the feature of the present application is the void portion 150 included in the through electrode 140. At this time, when the thickness of the insulating layer 110 is less than 80 um and the void portion 150 is included in the through electrode, the void portion 150 may act as a factor that reduces the strength of the circuit board. Therefore, in the embodiment, a through electrode 140 including a void portion 150 is formed in the insulating layer 110 having a thickness of 80 um or more, and this improves the elasticity and thermal shock characteristics of the circuit board while eliminating dimples formed in the pad part.

Meanwhile, the insulating layer 110 of the above embodiment may include prepreg. For example, the insulating layer 110 increases the physical strength of the circuit board and improves the warpage of the circuit board.

The prepreg constituting the insulating layer 110 of the embodiment may be formed by impregnating a fiber layer in the form of a fabric sheet, such as a glass fabric woven with glass yarn, with an epoxy resin, and then performing thermocompression. However, the prepreg 110 in the embodiment may include a fiber layer in the form of a fabric sheet woven with carbon fiber yarn.

Specifically, the insulating layer 110 may include a resin and a reinforcing fiber disposed in the resin. The resin may be an epoxy resin, but is not limited thereto. The resin is not particularly limited to the epoxy resin, and for example, one or more epoxy groups may be included in the molecule, or alternatively, two or more epoxy groups may be included, or alternatively, four or more epoxy groups may be included. In addition, the resin of the insulating layer 110 may include a naphthalene group, for example, may be an aromatic amine type, but is not limited thereto. For example, the resin may be include a bisphenol A type epoxy resin, a bisphenol F type epoxy resin, a bisphenol S type epoxy resin, a phenol novolac type epoxy resin, an alkylphenol novolac type epoxy resin, a biphenyl type epoxy resin, an aralkyl type epoxy resin, dicyclopentadiene type epoxy resin, naphthalene type epoxy resin, naphthol type epoxy resin, epoxy resin of condensate of phenol and aromatic aldehyde having phenolic hydroxyl group, biphenyl aralkyl type epoxy resin, fluorene type epoxy resin resins, xanthene-type epoxy resins, triglycidyl isocyanurate, rubber-modified epoxy resins, phosphorous-based epoxy resins, and the like, and naphthalene-based epoxy resins, bisphenol A-type epoxy resins, and phenol novolac epoxy resins, cresol novolak epoxy resins, rubber-modified epoxy resins, and phosphorous-based epoxy resins. In addition, the reinforcing fiber may include glass fiber, carbon fiber, aramid fiber (e.g., aramid-based organic material), nylon, silica-based inorganic material or titania-based inorganic material. The reinforcing fibers may be arranged in the resin to cross each other in a planar direction.

Meanwhile, the embodiment may use as the glass fiber, carbon fiber, aramid fiber (e.g., aramid-based organic material), nylon, silica-based inorganic material or titania-based inorganic material.

The circuit board of the embodiment includes a through electrode 140 that passes through the insulating layer 110. For example, the through electrode 140 may passes through the upper and lower surfaces of the insulating layer 110.

The through electrode 140 can be formed by filling a conductive material into a through hole passing through the upper and lower surfaces of the insulating layer 110. At this time, in the embodiment, the through electrode 140 is formed by filling only a portion of the through hole with a conductive material, rather than filling the entire through hole with a conductive material. Accordingly, some of the through holes of the embodiment may not be filled with conductive material.

For example, the through electrode 140 of the embodiment may include a void portion 150, which is an empty region not filled with the conductive material.

The void portion 150 may have a specific shape. For example, the void portion 150 may have a polygonal shape. For example, the void portion 150 may have a diamond shape. For example, the void portion 150 may have a triangular shape. At this time, a shape of the void portion 150 may mean a shape of the vertical cross section of the void portion 150. The vertical cross section may refer to a cross section cut in a vertical direction toward the upper and lower surfaces of the through electrode 140 of the embodiment. That is, the void portion 150 may have a shape such as a diamond or a triangle in a vertical cross section. At this time, the void portion 150 may have a shape such as the diamond or triangle in a vertical cross-section, and may have a curved surface on at least one side. For example, the void portion 150 may have a curved surface on which at least one side of the vertical cross-section is convex toward an outside. For example, the void portion 150 may have a curved surface on which at least one side of the vertical cross-section is concave toward an inside. However, the embodiment is not limited to this. For example, the void portion 150 may be deformed into various shapes within a range where the vertical cross-sectional shape is basically a triangle or a diamond shape. Additionally, the shape of the void portion 150 as described above may be achieved through changes in a width of a through hole penetrating the insulating layer 110 of the embodiment or changes in filling conditions of the conductive material. This will be explained in detail below.

Meanwhile, the through electrode 140 may have a first inclination such that the width gradually decreases from an upper surface to a lower surface of the insulating layer 110. For example, the through electrode 140 may have a trapezoidal shape with an upper width greater than a lower width. For example, when a through hole passing through the insulating layer 110 is formed, the through electrode 140 can be formed by filling the inside of the formed through hole with a conductive material.

The through hole may be formed by any one of mechanical, laser, and chemical processing. When the through hole is formed by machining, it can be formed using methods such as milling, drilling, and routing. When the through hole is formed by laser processing, it can be formed using methods such as UV or $CO_2$ laser. When the through hole is formed by chemical processing, it can be formed using a chemical containing amino silane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a $CO_2$ laser, or an ultraviolet (UV) laser. YAG laser is a laser that can process both copper foil layers and insulating layers, and CO2 laser is a laser that can process only insulating layers.

In this case, the metal material forming the through electrode 140 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

Meanwhile, the first circuit pattern layer 130 may be disposed on the upper surface of the insulating layer 110. At this time, the first circuit pattern layer 130 may include a first pad part that vertically overlaps the through electrode 140.

The first pad part of the first circuit pattern layer 130 may vertically overlap the upper surface of the through electrode 140. For example, an entire region of the upper surface of the through electrode 140 may vertically overlap the first pad part of the first circuit pattern layer 130. For example, a width of the first pad part may be greater than a width of the upper surface of the through electrode 140. At this time, the first pad part is arranged to entirely cover the upper surface of the through electrode 140, and accordingly, the characteristics of the function (e.g., signal transmission function, heat dissipation function, or shielding function) of the first pad part can be improved.

Additionally, the second pad part of the second circuit pattern layer 120 may vertically overlap the lower surface of the through electrode 140. For example, the entire region of the lower surface of the through electrode 140 may vertically overlap the second pad part of the second circuit pattern layer 120. For example, a width of the second pad part may be greater than a width of the lower surface of the through electrode 140. Accordingly, the embodiment allows signal transmission characteristics, heat dissipation characteristics, or shielding characteristics to be improved for the second pad part, corresponding to the first pad part.

Meanwhile, a width of the upper surface of the through electrode 140 is greater than a width of the lower surface. Accordingly, the width of the first pad part and the width of the second pad part may be different from each other. For example, the width of the first pad part may be greater than the width of the second pad part. However, the embodiment is not limited to this, and the width of the second pad part may be the same as the width of the first pad part or may be greater than the width of the first pad part.

The first circuit pattern layer 130 and the second circuit pattern layer 120 may be formed of at least one metal material selected from among gold (Au), silver (Ag), platinum (Pt), titanium (Ti), tin (Sn), copper (Cu), and zinc (Zn).

In addition, the first circuit pattern layer 130 and the second circuit pattern layer 120 are may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the first circuit pattern layer 130 and the second circuit pattern layer 120 may be formed of copper (Cu) having high electrical conductivity and a relatively low cost.

The first circuit pattern layer 130 and the second circuit pattern layer 120 can be formed using a conventional circuit board manufacturing process, such as the additive process, subtractive process, MSAP (Modified Semi Additive Process) and SAP (Semi Additive Process) methods, etc., and detailed descriptions thereof will be omitted here.

Hereinafter, the through electrode 140 and the void portion 150 included in the through electrode 140 according to an embodiment will be described in detail.

—Through Electrode and Void Portion—

Figure 4A:
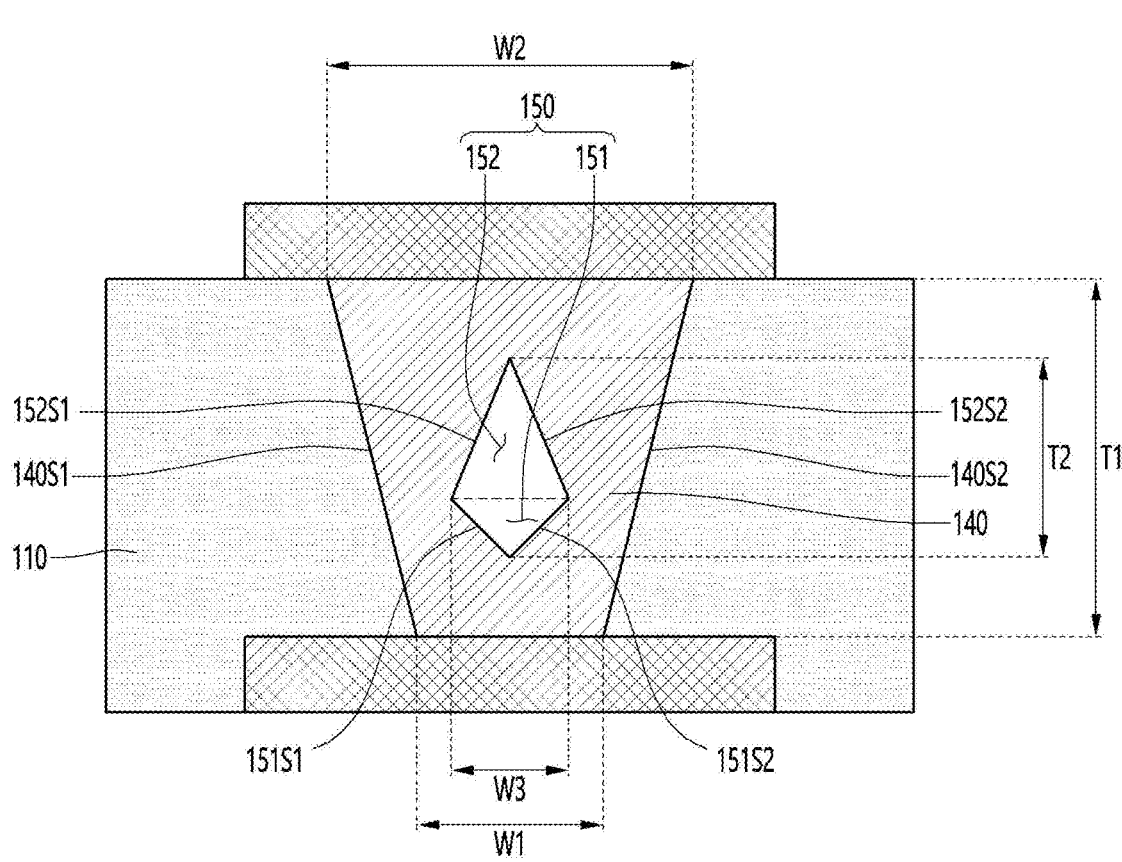
FIG. 4A is a view showing a through electrode according to a first embodiment.
Figure 4B:
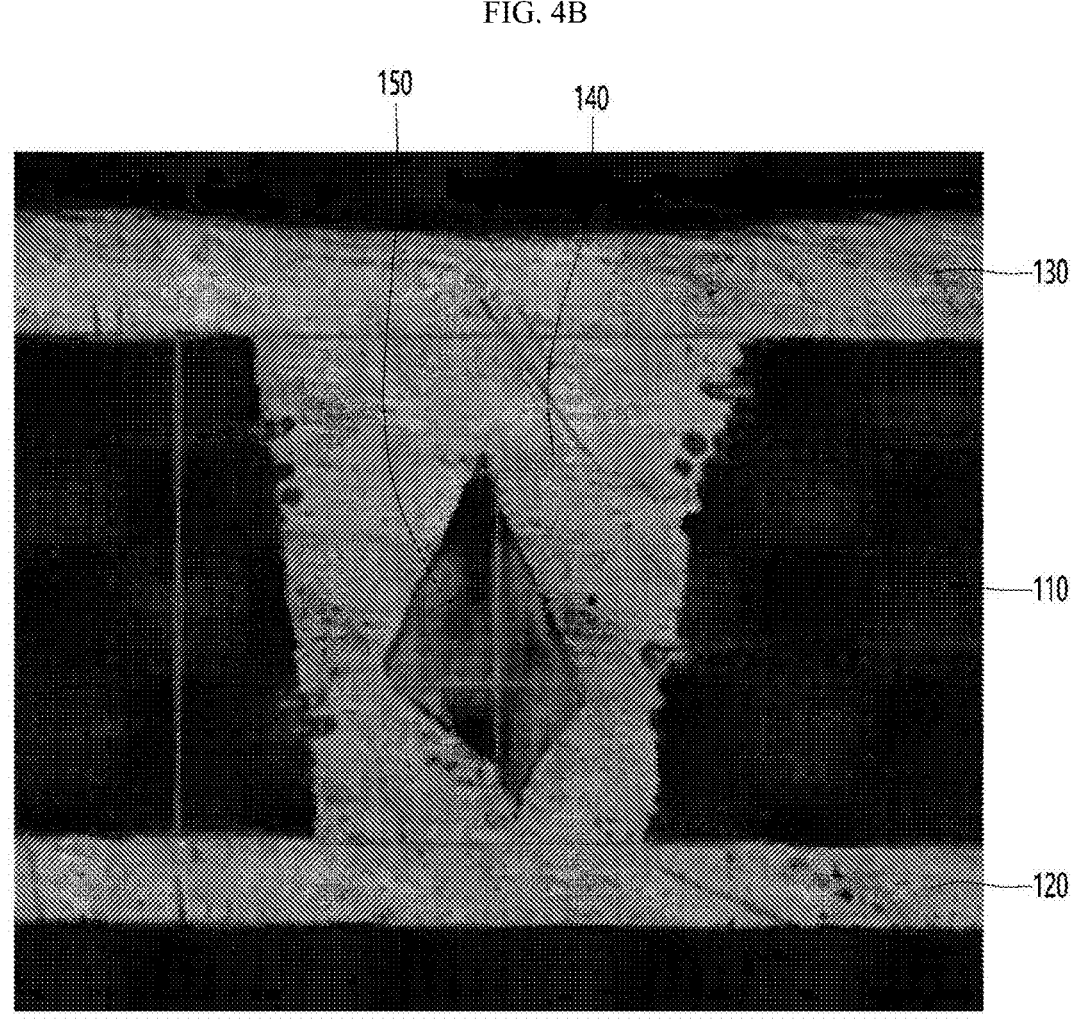
FIG. 4B is a micrograph of an actual product containing a void portion in a through electrode according to an embodiment.
Figure 4C:
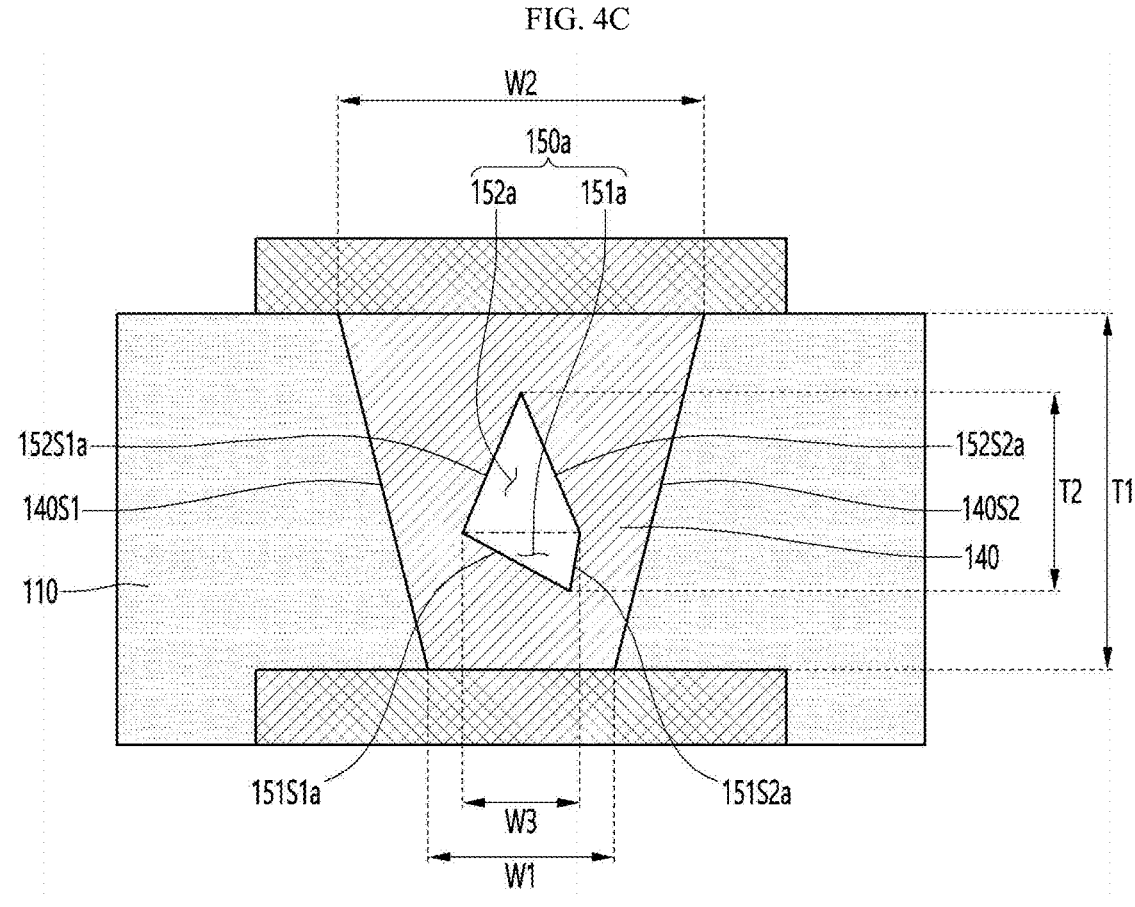
FIG. 4C is a view showing a through electrode according to a second embodiment.
Figure 4D:
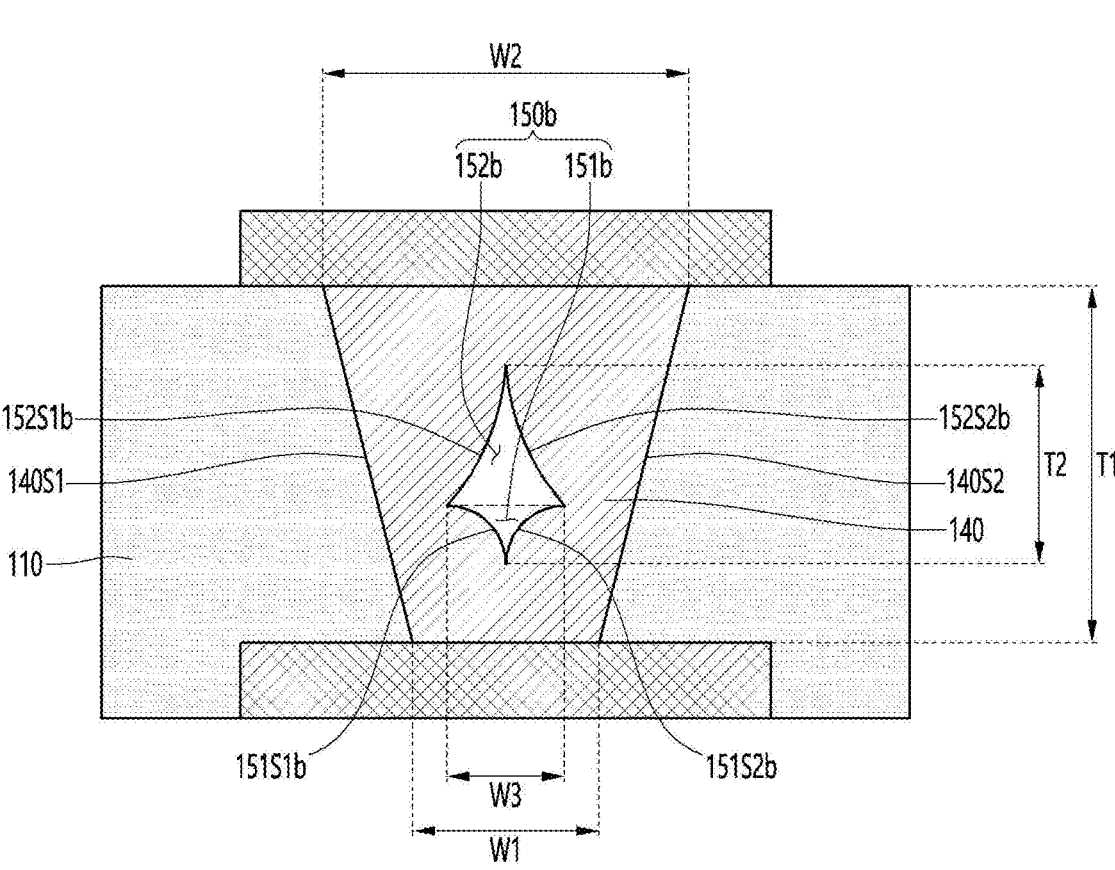
FIG. 4D is a view showing a through electrode according to a third embodiment.
Figure 4E:
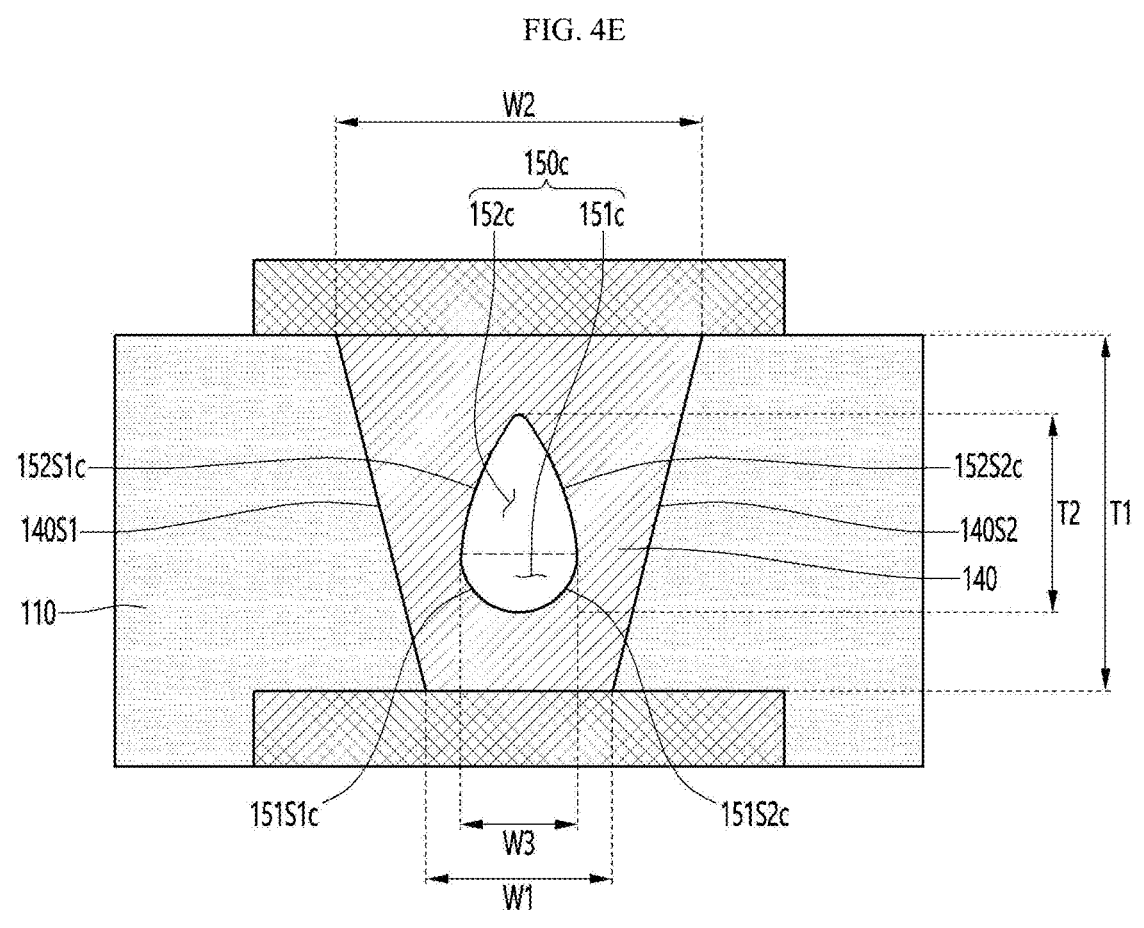
Figure 4F:
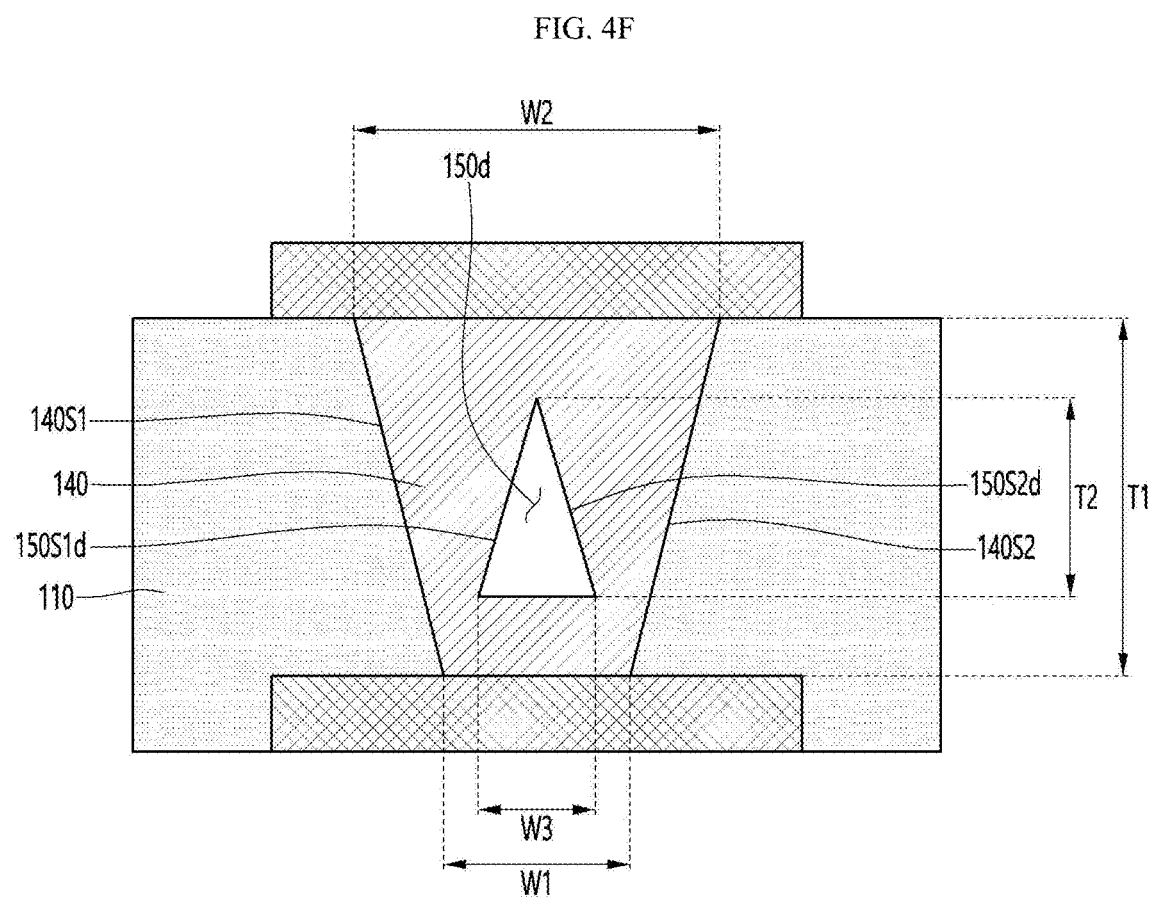

FIG. 4A is a view showing a through electrode according to a first embodiment, FIG. 4B is a micrograph of an actual product containing a void portion in a through electrode according to an embodiment, FIG. 4C is a view showing a through electrode according to a second embodiment, FIG. 4D is a view showing a through electrode according to a third embodiment, FIG. 4E is a view showing a through electrode according to a fourth embodiment, and FIG. 4F is a view showing a through electrode according to a fifth embodiment.

Referring to FIG. 4A, the through electrode 140 of the first embodiment includes a void portion 150.

At this time, the through electrode 140 may have a first inclination whose width gradually decreases from the upper surface to the lower surface.

For example, the through electrode 140 may have a first inclination whose width gradually decreases from the upper surface to the lower surface.

To this end, the through electrode 140 may include a first side surface 140S1 and a second side surface 140S2 opposite to the first side surface 140S1. The first side surface 140S1 and the second side surface 140S2 of the through electrode 140 may refer to sides of the through electrode 140 that face each other in a vertical cross section of the through electrode 140.

Also, the first side surface 140S1 of the through electrode 140 may have an inclination inclined in the first direction. For example, the first side surface 140S1 of the through electrode 140 may have an inclination inclined to the right.

Additionally, the second side surface 140S2 of the through electrode 140 may have an inclination inclined in a second direction different from the first direction. For example, the second side surface 140S2 of the through electrode 140 may have an inclination inclined to a left, which is opposite to the first side surface 140S1.

The through electrode 140 of the embodiment may have an inclination whose width gradually decreases from the upper surface to the lower surface as the inclined directions of the first side surface 140S1 and the second side surface 140S2 are different from each other.

The through electrode 140 includes a void portion 150.

The void portion 150 may be formed within the through electrode 140. For example, the void portion 150 may be an empty space or region in the through electrode 140 that is not filled with a conductive material.

The void portion 150 may have a specific shape to ensure thermal shock characteristic or elasticity of the circuit board.

Additionally, the void portion 150 may be formed to secure the flatness of the first pad part of the first circuit pattern layer 130. For example, the thickness of the insulating layer 110 is 80 um or more. At this time, when the thickness of the insulating layer 110 is 80 um or more, the depth of the through hole penetrating the insulating layer 110 increases, and accordingly, the plating uniformity of the first pad part disposed on the through hole decreases. As a result, the upper surface of the first pad part has a concave shape. Accordingly, the embodiment allows the void portion 150 to ensure flatness of the surface of the first pad part. For example, when filling the through hole, the embodiment allows the conductive material to form a void portion 150 by not filling a portion of the through hole. And, when filling the through hole, the embodiment allows a conductive material corresponding to an area of the void portion 150 to form the first pad part, and therefore, it is possible to ensure the flatness of the upper surface of the first pad part.

Furthermore, the embodiment uses the void portion 150 to ensure elasticity of the circuit board while maintaining of the circuit board.

For example, the void portion 150 may be divided into a plurality of regions in a thickness direction.

For example, the void portion 150 may include a first region 151 adjacent to the lower surface of the through electrode 140 having a second inclination so that the width gradually increases toward the upper surface of the through electrode 140.

In addition, the void portion 150 may include a second region 152 adjacent to the upper surface of the through electrode 140, communicating with the first region 151, and having a third inclination so that the width gradually decreases toward the upper surface of the through electrode 140.

At this time, the second inclination of the first region 151 of the void portion 150 and the third inclination of the second region 152 may be different from the first inclination. At this time, the fact that the first inclination, second inclination, and third inclination are different may mean that an inclination angle with respect to an upper or lower surface of the insulating layer 110 is different.

However, at least one of an inclined direction of the second inclination of the first region 151 of the void portion 150 and an inclined direction of the third inclination of the second region 152 may be the same as an inclined direction of the first inclination of the through electrode 140.

For example, the first region 151 of the void portion 150 may have a second inclination that is different from the first inclination. However, an inclined direction of the second inclination of the first region 151 of the void portion 150 may be the same as an inclined direction of the first inclination of the through electrode 140.

Specifically, the first region 151 of the void portion 150 may include a first side surface 151S1 facing the first side surface 140S1 of the first through electrode 140 in a vertical cross-section.

And, the first side surface 151S1 of the first region 151 of the void portion 150 may have a second inclination different from the first inclination of the first side surface 140S1 of the first through electrode 140. However, an inclined direction of the second inclination of the first side surface 151S1 of the first region 151 of the void portion 150 may be the same as an inclined direction of the first inclination of the first side surface 140S1 of the through electrode 140. For example, the second inclination of the first side surface 151S1 of the first region 151 of the void portion 150 may have an inclination inclined in a first direction. For example, the second inclination of the first side surface 151S1 of the first region 151 of the void portion 150 may have an inclination inclined to a right.

Additionally, the first region 151 of the void portion 150 may include a second side surface 151S2 facing the second side surface 140S2 of the first through electrode 140 in a vertical cross-section.

In addition, the second side surface 151S2 of the first region 151 of the void portion 150 may have a second inclination different from the first inclination of the second side surface 140S2 of the first through electrode 140. However, an inclined direction of the second inclination of the second side surface 151S2 of the first region 151 of the void portion 150 may be the same as an inclined direction of the first inclination of the second side surface 140S2 of the through electrode 140. For example, the second inclination of the second side surface 151S2 of the first region 151 of the void portion 150 may have an inclination inclined in a second direction. For example, the second inclination of the second side surface 151S2 of the first region 151 of the void portion 150 may have an inclination inclined toward the left.

In the embodiment, the elasticity of the through electrode 140 can be improved by using the first region 151 of the void portion 150, and further, the elasticity of the circuit board can be improved.

For example, the second inclination of the first region 151 of the void portion 150 is different from the first inclination of the through electrode 140. However, the first inclination and the second inclination have inclinations inclined in the same first direction.

Accordingly, when the through electrode 140 is shocked by thermal shock, the embodiment allows a flow space equal to the space occupied by the first region 151 of the void portion 150 to be secured, thereby improving the elasticity of the circuit board.

For example, in the embodiment, the elasticity of the through electrode 140 and, further, the circuit board can be secured simply by including the void portion 150 in the through electrode 140.

Furthermore, the embodiment enables absorption of the thermal shock within the first region 151 of the through electrode when thermal shock occurs. Furthermore, the embodiment allows the second inclination of the first region 151 of the void portion 150 of the through electrode 140 to be inclined in the same direction as the first inclination of the through electrode 140. Accordingly, when the thermal shock occurs within the first region 151, the embodiment allows the through electrode 140 to flow in the thermal shock direction, and accordingly, the elasticity of the through electrode and, further, the elasticity of the circuit board can be improved.

However, the second region 152 of the void portion 150 of the embodiment may have a third inclination that is different from the first inclination and the second inclination. However, a direction in which the third inclination of the second region 152 of the void portion 150 is inclined may be different from a direction in which the first and second inclinations are inclined.

For example, the direction in which the third inclination of the second region 152 of the void portion 150 of the embodiment is inclined may be different from a direction in which the first inclination of the through electrode 140 is inclined and the direction in which the second inclination of the first region 151 of the void portion 150 is inclined.

Specifically, the second region 152 of the void portion 150 may include a first side surface 152S1 facing the first side surface 140S1 of the first through electrode 140 in a vertical cross-section.

In addition, the first side surface 152S1 of the second region 152 of the void portion 150 may have a third inclination different from the first inclination of the first side surface 140S1 of the first through electrode 140. In addition, the direction in which the third inclination of the first side surface 152S1 of the second region 152 of the void portion 150 inclined may be different from a direction in which the first inclination of the first side surface 140S1 of the through electrode 140 is inclined. For example, the third inclination of the first side surface 152S1 of the second region 152 of the void portion 150 may have an inclination inclined in a second direction. For example, the third inclination of the first side surface 152S1 of the second region 152 of the void portion 150 may have an inclination inclined toward the left.

Meanwhile, the first side surface 152S1 of the second region 152 of the void portion 150 may contact the first side surface 151S1 of the first region 151 of the void portion 150. For example, the first side surface 152S1 of the second region 152 of the void portion 150 may be connected to the first side surface 151S1 of the first region 151 of the void portion 150. In addition, an inflection portion to have different second inclination and third inclination may be provided between the first side surface 152S1 of the second region 152 of the void portion 150 and the first side surface 151S1 of the first region 151 of the void portion 150.

Additionally, the second region 152 of the void portion 150 may include a second side surface 152S2 facing the second side surface 140S2 of the first through electrode 140 in a vertical cross-section.

And, the second side surface 152S2 of the second region 152 of the void portion 150 may have a third inclination different from the first inclination of the second side surface 140S2 of the first through electrode 140. In addition, a direction in which the third inclination of the second side surface 152S2 of the second region 152 of the void portion 150 is inclined may be different from the direction in which the first inclination of the second side surface 140S2 of the through electrode 140 is inclined. For example, the third inclination of the second side surface 152S2 of the second region 152 of the void portion 150 may have an inclination inclined in the first direction. For example, the third inclination of the second side surface 152S2 of the second region 152 of the void portion 150 may have an inclination inclined to the right.

Meanwhile, the second side surface 152S2 of the second region 152 of the void portion 150 may contact the second side surface 151S2 of the first region 151 of the void portion 150. For example, the second side surface 152S2 of the second region 152 of the void portion 150 may be connected to the second side surface 151S2 of the first region 151 of the void portion 150. In addition, an inflection portion to have different second inclination and third inclination may be provided between the second side surface 152S2 of the second region 152 of the void portion 150 and the first side surface 151S2 of the first region 151 of the void portion 150.

The embodiment uses the second region 152 of the void portion 150 to secure the strength of the through electrode 140 and, further the strength of the circuit board.

For example, when a void portion 150 is formed in the through electrode 140, the strength of the through electrode 140 may decrease by the region where the void portion 150 is formed, and further, the strength of the circuit board may decrease. At this time, the embodiment minimizes the decrease in strength of the through electrode 140 and the strength of the circuit board through the second region 152 of the void portion 150.

For example, the third inclination of the second region 152 of the void portion 150 is different from the first inclination of the through electrode 140, and is inclined in a second direction different from the first inclination.

Accordingly, the embodiment uses the fact that the first inclination and the third inclination are inclined in different directions to improve the strength of the through electrode 140.

Specifically, when the first inclination and the third inclination are inclined in different directions, the strength of the through electrode 140 can be improved. For example, when an external shock is applied, the third inclination is inclined in a direction different from the inclined direction of the first inclination, accordingly, it can serve a support function to suppress bending of the through electrode 140 or bending of the circuit board due to damage due to the impact. For example, the direction in which the third inclination is inclined is different from the direction in which the first inclination is inclined, so that it can serve a supporting function to increase the strength of the through electrode 140 having the first inclination, and thus the strength of the circuit board can be improved.

Meanwhile, in an embodiment, a thickness T2 or vertical distance T2 of the void portion 150 is smaller than the thickness T1 or vertical distance T1 of the through electrode 140.

For example, the vertical distance T2 of the void portion 150 may mean a vertical distance from a lowermost end of the first region 151 of the void portion 150 to an uppermost end of the second region 152.

The thickness T2 or vertical distance T2 of the void portion 150 may satisfy a range of 20% to 80% of the thickness T1 or vertical distance T1 of the through electrode 140. For example, the thickness T2 or vertical distance T2 of the void portion 150 may satisfy a range of 25% to 75% of the thickness T1 or vertical distance T1 of the through electrode 140. For example, the thickness T2 or vertical distance T2 of the void portion 150 may satisfy a range of 30% to 70% of the thickness T1 or vertical distance T1 of the through electrode 140.

If the thickness T2 or vertical distance T2 of the void portion 150 is less than 20% of the thickness T1 or vertical distance T1 of the through electrode 140, a concave portion may be included on the upper surface of the first pad part. In addition, if the thickness T2 or vertical distance T2 of the void portion 150 is less than 20% of the thickness T1 or vertical distance T1 of the through electrode 140, the effect of improving the elasticity of the circuit board may be minimal.

In addition, if the thickness T2 or vertical distance T2 of the void portion 150 is greater than 80% of the thickness T1 or vertical distance T1 of the through electrode 140, a first pattern portion of the first circuit pattern layer 130 and a second pattern portion of the second circuit pattern layer 120 may not be connected. For example, if the thickness T2 or vertical distance T2 of the void portion 150 is greater than 80% of the thickness T1 or vertical distance T1 of the through electrode 140, at least a portion of the lower surface of the first pad part or the upper surface of the second pad part may not be in direct contact with the through electrode 140, which may cause electrical reliability problems.

Meanwhile, in an embodiment, a vertical distance of the first region 151 of the void portion 150 is smaller than a vertical distance of the second region 152. For example, a length of the first side surface 151S1 of the first region 151 of the void portion is shorter than a length of the first side surface 152S1 of the second region 152 of the void portion 150. For example, the length of the second side surface 151S2 of the first region 151 of the void portion is shorter than the length of the second side surface 152S2 of the second region 152 of the void portion 150. For example, if the vertical distance of the first region 151 of the void portion 150 is greater than the vertical distance of the second region 152, the elasticity of the through electrode 140 increases, but the strength of the through electrode 140 and the strength of the circuit board may decrease below a certain level, and as a result, physical or electrical reliability problems may occur.

Meanwhile, a width W1 of the lower surface of the through electrode 140 may be smaller than the width W2 of the upper surface. At this time, the width W1 of the lower surface of the through electrode 140 is set to satisfy a range of 80% to 99% of the width W2 of the upper surface. For example, the width W1 of the lower surface of the through electrode 140 satisfies a range of 82% to 95% of the width W2 of the upper surface. For example, the width W1 of the lower surface of the through electrode 140 satisfies the range of 85% to 93% of the width W2 of the upper surface. If the width W1 of the lower surface of the through electrode 140 is less than 80% of the width W2 of the upper surface, there is a sharp difference between the filling speed in the upper region and the filling speed in the lower region in a process of filling the through hole, and as a result, the width or vertical distance of the void portion formed within the through electrode may increase. In addition, if the width W1 of the lower surface of the through electrode 140 is greater than 99% of the width W2 of the upper surface, a void portion having a shape corresponding to the embodiment of the present application may not be formed in the through hole.

Meanwhile, a width W3 of a widest region in the void portion 150 is set to satisfy a range of 30% to 80% of the width W1 of the lower surface of the through electrode 140. For example, a width W3 of a widest region in the void portion 150 is set to satisfy a range of 35% to 75% of the width W1 of the lower surface of the through electrode 140. For example, a width W3 of a widest region in the void portion 150 is set to satisfy a range of 40% to 70% of the width W1 of the lower surface of the through electrode 140.

If the width W3 of the widest region in the void portion 150 is less than 30% of the width W1 of the lower surface of the through electrode 140, the elasticity of the through electrode 140 and, further the elasticity of the circuit board may be reduced. In addition, if the width W3 of the widest region in the void portion 150 exceeds 80% of the width W1 of the lower surface of the through electrode 140, the strength of the through electrode and the strength of the circuit board may decrease.

As described above, the embodiment forms a void portion 150 within the through electrode 140. In addition, the elasticity of the through electrode and the circuit board can be further improved by allowing the void portion 150 to include a first region 151 having a second inclination. In addition, the embodiment allows for the inclusion of a second region 152 with a third inclination, the strength of the through electrode 140 and the circuit board can be maintained above a certain level even when the void portion 150 is included.

Meanwhile, the shape of the void portion 150 of the embodiment may be determined by the shape of the through electrode 140 (specifically, the shape of a through hole) and the filling conditions when filling the conductive material. For example, the embodiment may allow adjusting the width of the lower surface of the through electrode 140 compared to the width of the upper surface, and accordingly, the width and vertical distance of the void portion 150 can be controlled, and further, the overall shape of the void portion 150 can be controlled.

Referring to FIGS. 4B and 4C, the embodiment may control a shape of the void portion 150 by controlling a shape of the through electrode 140.

For example, the through electrode 140 may include a void portion 150a. Additionally, the void portion 150a may include a first region 151a and a second region 152a.

At this time, the embodiment may control the shape of the first region 152a of the void portion 150a by adjusting the first inclination of the through electrode 140 (e.g. by increasing or decreasing the inclined angle).

For example, the first region 151a of the void portion 150a of the second embodiment includes a first side surface 151S1a and a second side surface 151S2a.

At this time, a first horizontal distance between the first side surface 151S1a of the first region 151a of the void portion 150a and the first side surface 140S1 of the through electrode 140 may be different from the second horizontal distance between the second side surface 151S2a of the first region 151a of the void portion 150a and the second side surface 140S2 of the through electrode 140. For example, the first horizontal distance may rapidly increase toward the lower surface of the through electrode 140, and the second horizontal distance may remain unchanged or may change slightly toward the lower surface of the through electrode 140.

Referring to FIG. 4D, the embodiment may adjust the filling conditions of the conductive material in the through hole so that the void portion 150 can have various shapes. At this time, basically, the vertical cross-sectional shape of the void portion 150 may be a diamond shape. However, shapes of side surfaces of the first and second regions of the void portion 150 may change.

For example, the first side surface 151S1 and the second side surface 151S2 of the first region 151 of the void portion 150 in FIG. 4A have the shape of a straight line with the second inclination. Additionally, the first side surface 152S1 and the second side surface 152S2 of the second region 152 of the void portion 150 in FIG. 4A have the shape of a straight line with the third inclination.

Unlike this, at least one of the side surfaces of the first region 151b and the second region 152b of the void portion 150b of the third embodiment may have a curved surface.

For example, in FIG. 4D, the side surfaces of the first region 151b and the second region 152b of the void portion 150b are shown as having curved surfaces, but the embodiment is not limited thereto. That is, any one of the side surfaces of the first region 151b and the second region 152b of the void portion 150b may have a curved surface.

For example, the first side surface 151S1b and the second side surface 151S2b of the first region 151b of the void portion 150b may have a curved surface having a second inclination. For example, the curved surface may mean a curved surface in a thickness direction in a vertical cross section of the first region 151b. At this time, the first side surface 151S1b and the second side surface 151S2b of the first region 151b of the void portion 150b may have a concave curved surface in an inner direction of the void portion 150b.

For example, the first side surface 152S1b and the second side surface 152S2b of the second region 152b of the void portion 150b may have a curved surface having a third inclination. For example, the curved surface may mean a curved surface in a thickness direction in a vertical cross section of the second region 152b. At this time, the first side surface 152S1b and the second side surface 152S2b of the second region 152b of the void portion 150b may have a concave curved surface in an inner direction of the void portion 150b.

Specifically, having the curved surface may mean that the first side surface 151S1b or the second side surface 151S2b of the first region 151b has a curve with a certain curvature in the thickness direction. And, the second inclination may mean an inclination of a virtual straight line connecting one end and the other end of the first side surface 151S1b or the second side surface 151S2b of the first region 151b.

Correspondingly, having the curved surface may mean that the first side surface 152S1b or the second side surface 152S2b of the second region 152b has a curve with a certain curvature in the thickness direction. And, the third inclination may mean an inclination of a virtual straight line connecting one end and the other end of the first side surface 152S1b or the second side surface 152S2b of the second region 152b.

Referring to FIG. 4E, the embodiment may adjust the filling conditions of the conductive material in the through hole so that the void portion 150 can have various shapes. At this time, basically, the vertical cross-sectional shape of the void portion 150 may be a diamond shape. However, the shapes of the side surfaces of the first and second regions of the void portion 150 may change.

For example, the first side surface 151S1 and the second side surface 151S2 of the first region 151 of the void portion 150 in FIG. 4A have the shape of a straight line with the second inclination. Additionally, the first side surface 152S1 and the second side surface 152S2 of the second region 152 of the void portion 150 in FIG. 4A have the shape of a straight line with the third inclination.

Unlike this, at least one of the side surfaces of the first region 151c and the second region 152c of the void portion 150c of the fourth embodiment may have a curved surface.

For example, in FIG. 4E, the side surfaces of the first region 151c and the second region 152c of the void portion 150c are shown as having curved surfaces, but the embodiment is not limited thereto. That is, any one of the side surfaces of the first region 151c and the second region 152c of the void portion 150c may have a curved surface.

For example, the first side surface 151S1c and the second side surface 151S2c of the first region 151c of the void portion 150c may have a curved surface having the second inclination. For example, the curved surface may mean a curved surface in the thickness direction in the vertical cross section of the first region 151c. At this time, the first side surface 151S1c and the second side surface 151S2c of the first region 151c of the void portion 150c may have a convex curved surface toward the outside of the void portion 150c.

For example, the first side surface 152S1c and the second side surface 152S2c of the second region 152c of the void portion 150c may have a curved surface having the third inclination. For example, the curved surface may mean a curved surface in the thickness direction in the vertical cross section of the second region 152c. At this time, the first side surface 152S1c and the second side surface 152S2c of the second region 152c of the void portion 150c may have a concave curved surface toward the outside of the void portion 150c.

For example, the void portion 150c may have an egg shape.

Having the curved surface may mean that the first side surface 151S1c or the second side surface 151S2c of the first region 151c has a curve with a certain curvature in the thickness direction. And, the second inclination may mean an inclination of a virtual straight line connecting one end and the other end of the first side surface 151S1c or the second side surface 151S2c of the first region 151c.

Additionally, correspondingly, having the curved surface may mean that the first side surface 152S1c or the second side surface 152S2c of the second region 152c has a curve with a certain curvature in the thickness direction. And, the third inclination may mean an inclination of a virtual straight line connecting one end and the other end of the first side surface 152S1c or the second side surface 152S2c of the second region 152c.

Meanwhile, in the embodiment, it is possible to form a void portion having a combination of FIGS. 4D and 4E, and it is also possible to form a structure in which the concave curved surface and the convex curved surface are mixed on at least one side surface of the first region and the second region of the void portion.

Referring to FIG. 4F, the embodiment may adjust the filling conditions of the conductive material in the through hole so that the void portion 150 can have various shapes. At this time, the void portion 150d of the fifth embodiment may have a triangular vertical cross-sectional shape.

The void portion can only be the second region excluding the first region by reducing the width of the lower surface of the through electrode 140 compared to the first embodiment.

Accordingly, according to the fifth embodiment, a vertical cross-section of the void portion 150d has a triangular shape, and thus may include only the first side surface 150S1d and the second side surface 150S2d having the third inclination.

At this time, even if the void portion 150d is provided, a certain degree of elasticity of the circuit board can be secured. Accordingly, the embodiment allows solving the strength problem that may occur due to the void portion while maintaining the flatness of the first pad part of the circuit board by adjusting the vertical cross section of the void portion 150d to have a triangular shape.

Meanwhile, in FIG. 4F, both the first side surface 150S1d and the second side surface 150S2d are formed as straight lines with a third inclination, but this is not limited to this, and one side surface may have a concave curved surface in the inward direction or a convex curved surface in the outward direction.

Meanwhile, in FIGS. 4A to 4F, the side surface of each void portion may have a curved surface or a straight line according to the vertical cross-sectional direction.

For example, in FIGS. 4A to 4F, the side surface of each void portion may have a different shape depending on a cutting direction of the vertical cross section.

For example, the vertical cross section of the circuit board may be a cross section cut based on the width direction (or x-axis direction or horizontal direction in a plane) of the circuit board, or it may be a cross-section cut based on the longitudinal direction (or the y-axis direction or the vertical direction in the plane), or it may be a cross section cut based on the diagonal direction between the width direction and the longitudinal direction. In addition, the shape of the side surface of the void portion in each cross section may have any one of a straight line, a convex curve, a concave curve, and a combination thereof.

For example, in one void portion: the side surface in the first vertical section (for example, a vertical section cut based on the width direction) may be a straight line with a certain inclination, the side surface in the second vertical cross section (e.g., a vertical cross section cut based on the longitudinal direction) may have a certain inclination and have a concave curved surface depressed in the inward direction, and the side surface in the third vertical cross section (for example, a vertical cross section cut based on the diagonal direction) may have a certain inclination and may have a curved surface that is convex in the outward direction.

For example, one void portion may have a shape that is a combination of at least two side surfaces among a straight line, a concave curve, and a convex curve with a certain inclination along the vertical cross-sectional direction.

The circuit board of the embodiment includes an insulating layer and a through electrode passing through the insulating layer. At this time, the through electrode includes a void portion, which is an empty space not filled with a conductive material. Additionally, the embodiment includes a first pad part disposed on the upper surface of the through electrode. At this time, a thickness of the through electrode may exceed 80 um, and the upper surface of the first pad part may be a flat surface that does not include a concave portion. That is, in the comparative example, a thickness of the through electrode is above a certain level, and accordingly, a concave portion concave downward is provided at an upper surface of the first pad part. In contrast, the embodiment includes a void portion in the through electrode, thereby eliminating the concave portion formed at the first pad part. Accordingly, the embodiment can maintain the flatness of the circuit board and thereby improve the electrical reliability and physical reliability of the circuit board. Additionally, the embodiment can omit an additional plating process and polishing process performed to remove the concave portion, thereby simplifying a process of manufacturing.

Meanwhile, the void portion within the through electrode of the embodiment may include a first region having a second inclination different from the first inclination of the through electrode. At this time, the second inclination may be different from the first inclination only in an angle of inclination, but a direction of inclination may be the same. In addition, the embodiment allows improving the elasticity of the through electrode and the elasticity of the circuit board through the first region of the void portion having the second inclination in the same inclined direction as the first inclination, as a result, the embodiment can absorb damage from thermal shock. Accordingly, the embodiment can inhibit cracks that may occur due to damage that may occur in various usage environments, and thus improve the physical reliability of the circuit board.

Additionally, the void portion of the through electrode of the embodiment may include a second region having a third inclination different from the first inclination of the through electrode. At this time, the third inclination may be different from the first inclination in not only an angle of inclination but also a direction of inclination. In addition, the embodiment allows to improve the strength of the through electrode by using the second region of the void portion having a third inclination having a in inclination direction different from the first inclination, furthermore, the strength of the circuit board can be improved, and through this, warpage characteristics can be improved. That is, the inclined direction of the second region of the void portion with the third inclination is different from the inclined direction of the first inclination of the through electrode, and accordingly, it can function to support the through electrode, thereby improving the strength of the through electrode and the circuit board.

Figure 5:
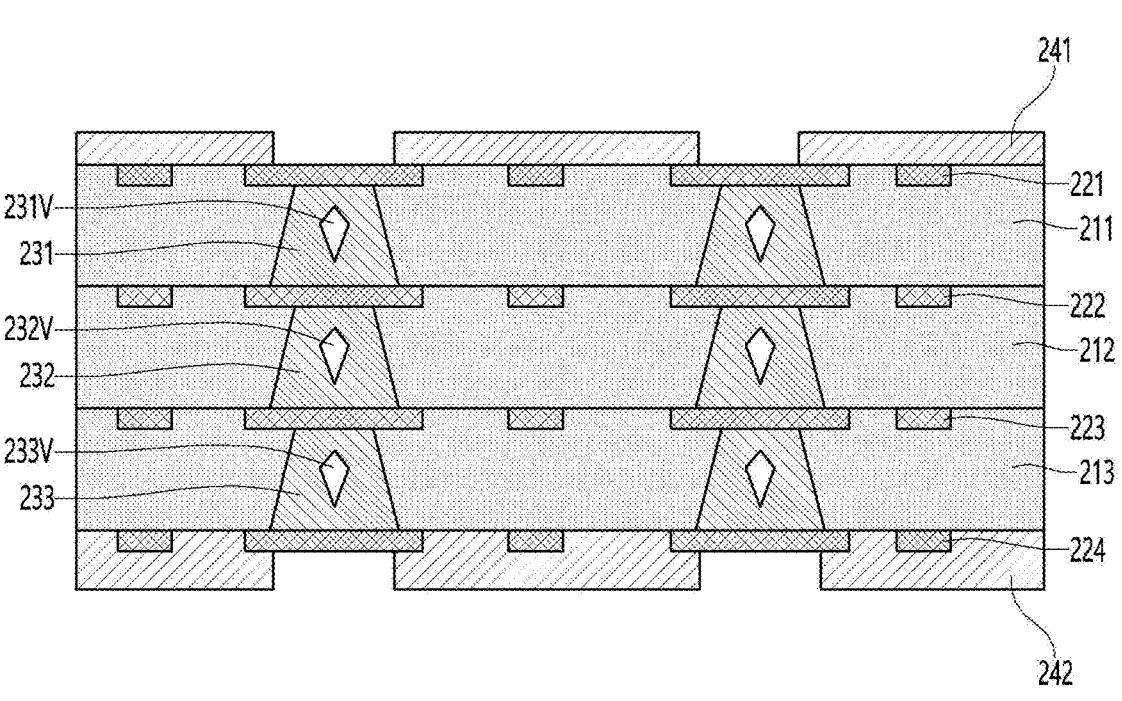
FIG. 5 is a view showing a circuit board with a multilayer structure according to an embodiment.

FIG. 5 is a view showing a circuit board with a multilayer structure according to an embodiment.

Referring to FIG. 5, a circuit board according to an embodiment may have a multilayer structure. For example, the circuit board of the embodiment may be a multilayer board manufactured using the Embedded Trace Substrate (ETS) method.

For example, a circuit board may have a three-layer structure based on the number of insulating layers. However, the embodiment is not limited to this, and the circuit board may have a two-layer structure, and alternatively, may have four or more layers.

Additionally, the circuit board having a multi-layer structure may have a multi-layer structure, as shown in FIG. 3.

For example, the insulating layer of the circuit board may include a first insulating layer 211, a second insulating layer 212, and a third insulating layer 213.

For example, the circuit pattern layer of the circuit board may include a first circuit pattern layer 221, a second circuit pattern layer 222, a third circuit pattern layer 223, and a fourth circuit pattern layer 224.

For example, the through electrode of the circuit board may include a first through electrode 231, a second through electrode 232, and a third through electrode 233.

At this time, the first through electrode 231, the second through electrode 232, and the third through electrode 233 may have a shape and structure corresponding to the through electrode 140 in FIGS. 2A-2G.

For example, the first through electrode 231 may include a first void portion 231V.

For example, the second through electrode 232 may include a second void portion 232V.

For example, the third through electrode 233 may include a third void portion 233V.

At this time, the first void portion 231V, the second void portion 232V, and the third void portion 233V may have the same shape or different shapes.

For example, the first void portion 231V, the second void portion 232V, and the third void portion 233V may all have the same shape as shown in FIGS. 4A to 4F.

For example, at least one of the first void portion 231V, the second void portion 232V, and the third void portion 233V may have the first shape of any one of FIGS. 4A to 4F, and At least the other one of the first void portion 231V, the second void portion 232V, and the third void portion 233V may have a second shape different from the first shape in FIGS. 4A to 4F. For example, one void portion may have a diamond-shaped vertical cross-section, and the other void portion may have a triangular shape.

Additionally, a protective layer of the circuit board may include a first protective layer 241 and a second protective layer 242.

Meanwhile, the circuit board in FIG. 5 is a coreless board and shows an example of having an ETS structure. Unlike this, the circuit board may be a core board. For example, a circuit board may include a core layer.

—Package Substrate—

Figure 6:
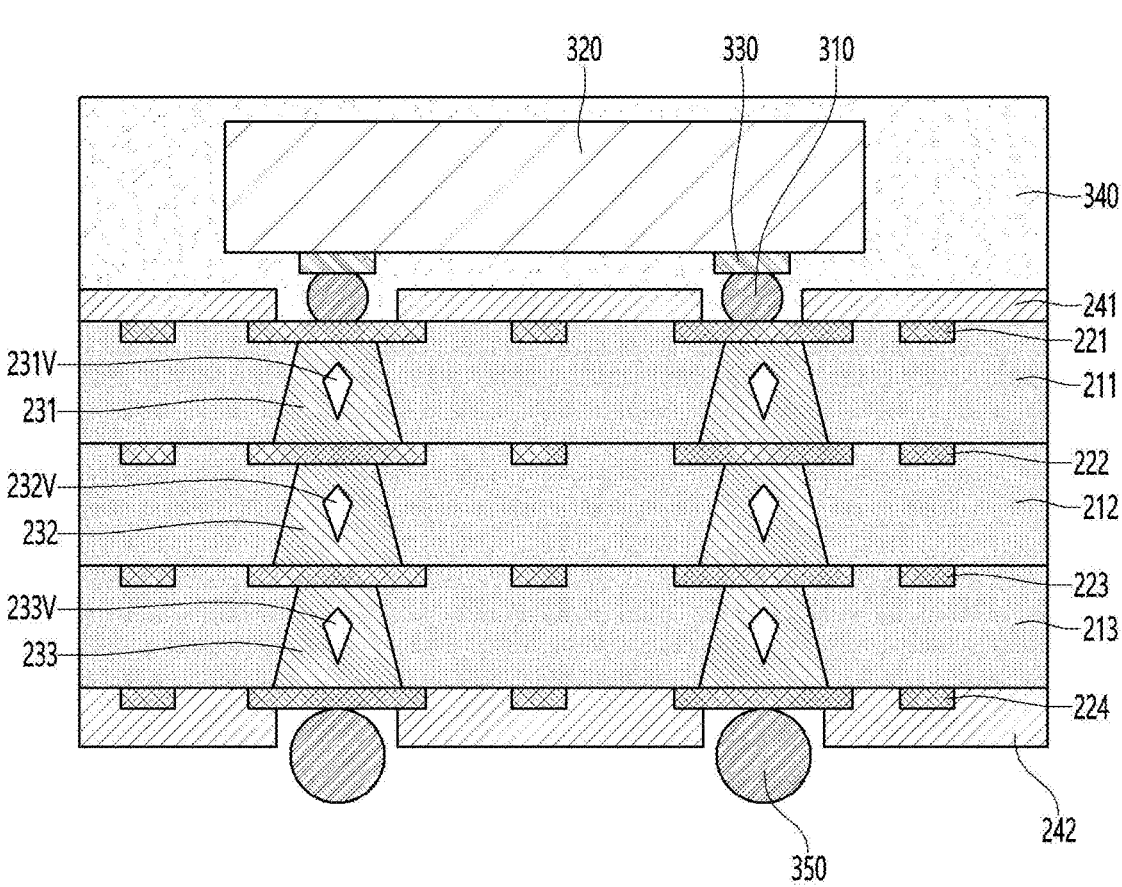
FIG. 6 is a view showing a package substrate according to an embodiment.

FIG. 6 is a view showing a package substrate according to an embodiment.

Referring to FIG. 6, the package substrate of the embodiment may represent a substrate region of any one of the semiconductor packages of FIGS. 2A to 2G. The package substrate includes a circuit board, at least one chip mounted on the circuit board, a molding layer for molding the chip, and a connection part for connecting the chip or an external substrate.

For example, the package substrate of the embodiment may include a first connection part 310 disposed on the first circuit pattern layer 221, which is an uppermost pattern layer. A cross section of the first connection part 310 may include a circular shape or a semicircular shape. For example, a cross-section of the first connection part 310 may include a partially or entirely rounded shape. A cross-sectional shape of the first connection part 310 may be flat at one side and curved at the other side. The first connection part 310 may be a solder ball, but is not limited thereto.

Meanwhile, the embodiment may include a chip 320 disposed on the first connection part 310. The chip 320 may be a processor chip. For example, the chip 320 may be an application processor (AP) chip selected from a central processor (e.g., CPU), a graphics processor (e.g., GPU), a digital signal processor, a cryptographic processor, a microprocessor, or a microcontroller. A terminal 330 of the chip 320 may be connected to the first circuit pattern layer 221 through the first connection part 310. For example, the first circuit pattern layer 221 may include a mounting pad on which the chip 320 is mounted.

In addition, although not shown in the drawing, the package substrate of the embodiment may further include an additional chip. For example, an embodiment may allow at least two chips of a central processor (e.g., CPU), a graphics processor (e.g., GPU), a digital signal processor, a cryptographic processor, a microprocessor, or a microcontroller to be respectively disposed at a regular spacing on the circuit board. For example, the chip 320 of the embodiment may include a central processor chip and a graphics processor chip, but is not limited thereto.

Meanwhile, the plurality of chips may be spaced apart from each other at a predetermined spacing on the circuit board. For example, the spacing between the plurality of chips may be 150 um or less. For example, the spacing between the plurality of chips may be 120 um or less. For example, the spacing between the plurality of chips may be 100 um or less.

Preferably, the spacing between the plurality of chips may range from 60 um to 150 um. Preferably, the spacing between the plurality of chips may range from 70 um to 120 um. Preferably, the spacing between the plurality of chips may range from 80 um to 110 um. If the spacing between the plurality of chips is less than 60 um, problems with operation reliability may occur due to mutual interference between the plurality of chips. If the spacing between the plurality of chips is greater than 150 um, signal transmission loss may increase as the distance between the plurality of chips increases. If the spacing between the plurality of chips is greater than 150 um, the volume of the package substrate may increase.

The package substrate may include a molding layer 340. The molding layer 340 may be disposed to cover the chip 320. For example, the molding layer 340 may be EMC (Epoxy Mold Compound) formed to protect the mounted chip 320, but is not limited thereto.

At this time, the molding layer 340 may have a low dielectric constant in order to increase heat dissipation characteristics. For example, the dielectric constant (Dk) of the molding layer 340 may be 0.2 to 10. For example, the dielectric constant (Dk) of the molding layer 340 may be 0.5 to 8. For example, the dielectric constant (Dk) of the molding layer 340 may be 0.8 to 5. Accordingly, the embodiment allows the molding layer 340 to have a low dielectric constant, thereby improving heat dissipation characteristics for heat generated from the chip 30.

Meanwhile, the package substrate may include a second connection part 350 disposed on the lower surface of the fourth circuit pattern layer 224 formed on the lowermost side of the circuit board.

The second connection part 350 may be a connection part for bonding the package substrate of the embodiment to the main board of the upper device.

—Method of Manufacturing Method Circuit Board—

Hereinafter, the manufacturing method of the circuit board shown in FIG. 5 according to an embodiment will be described in order of processes.

Figure 7A:
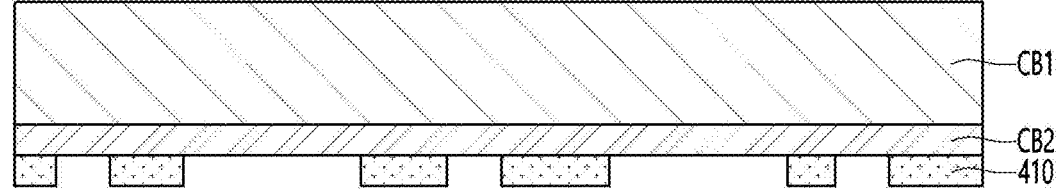
FIGS. 7A-7I are views showing a method of manufacturing the circuit board shown in FIG. 5 in order of processes.
Figure 7B:
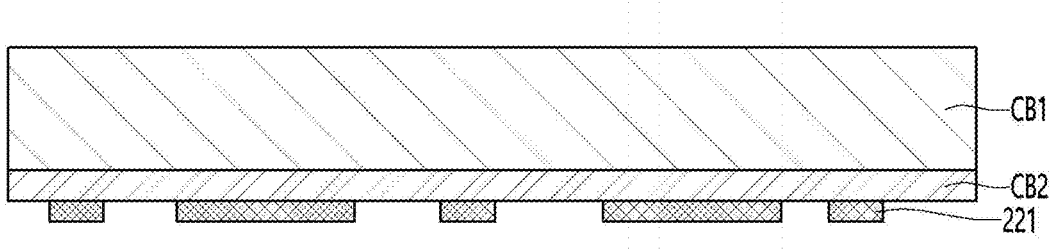
Figure 7C:
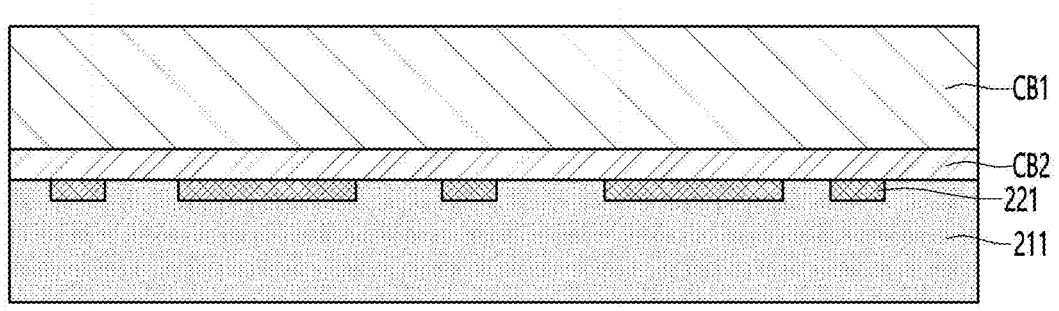
Figure 7D:
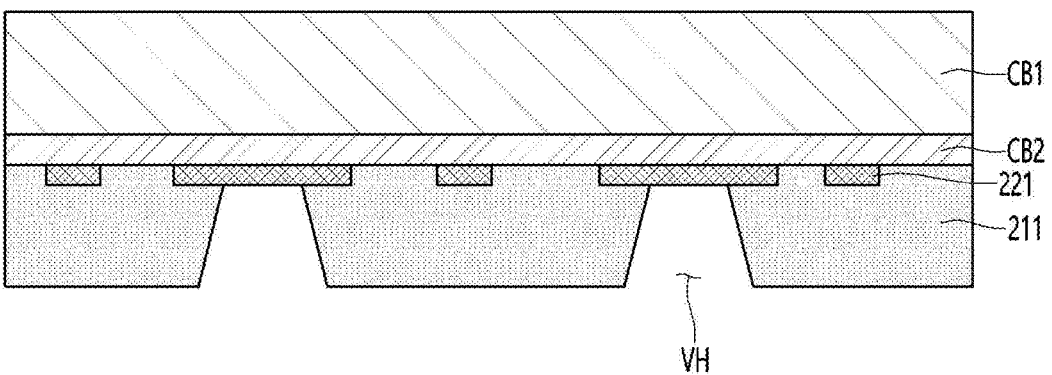
Figure 7E:
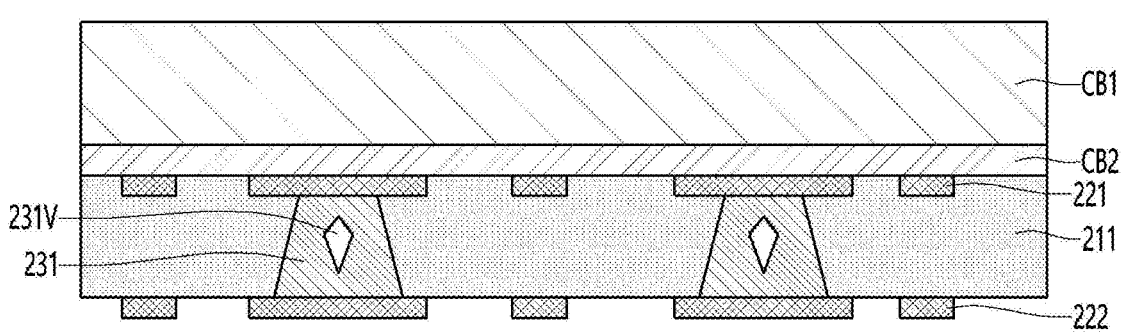
Figure 7F:
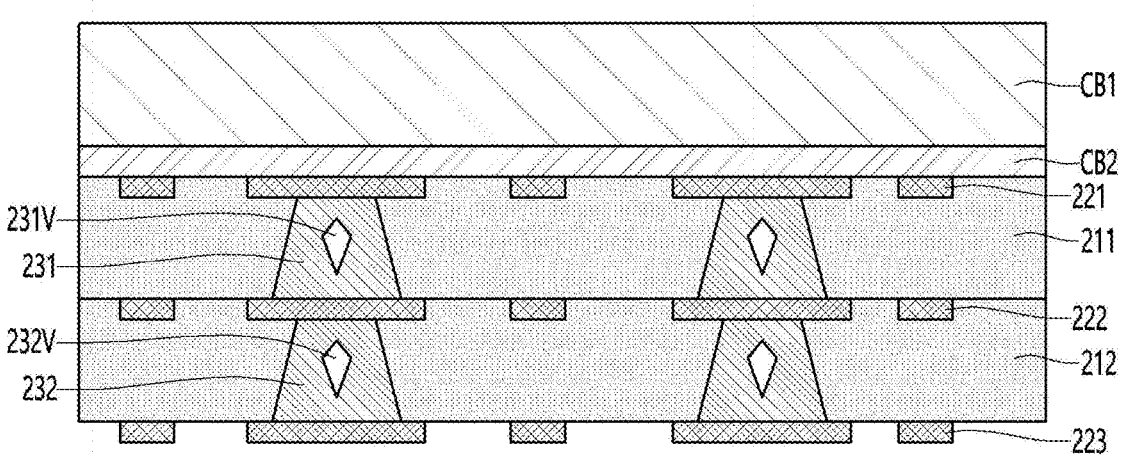
Figure 7G:
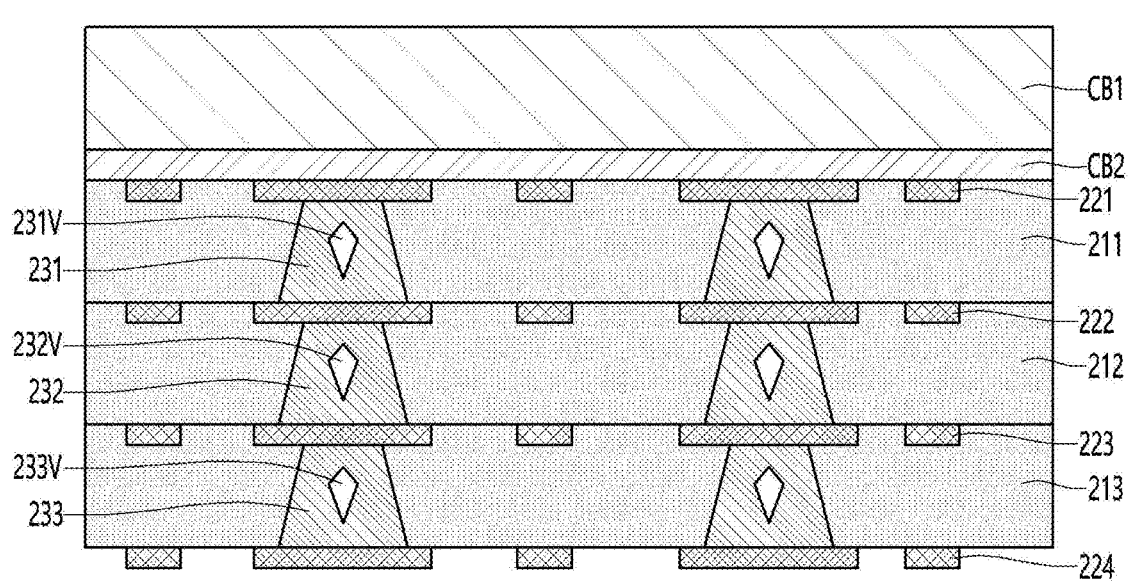
Figure 7H:
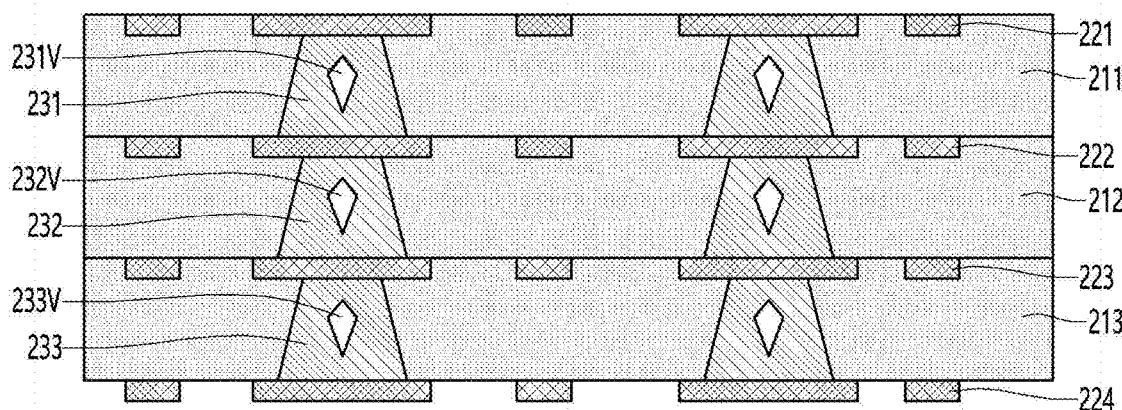
Figure 7I:
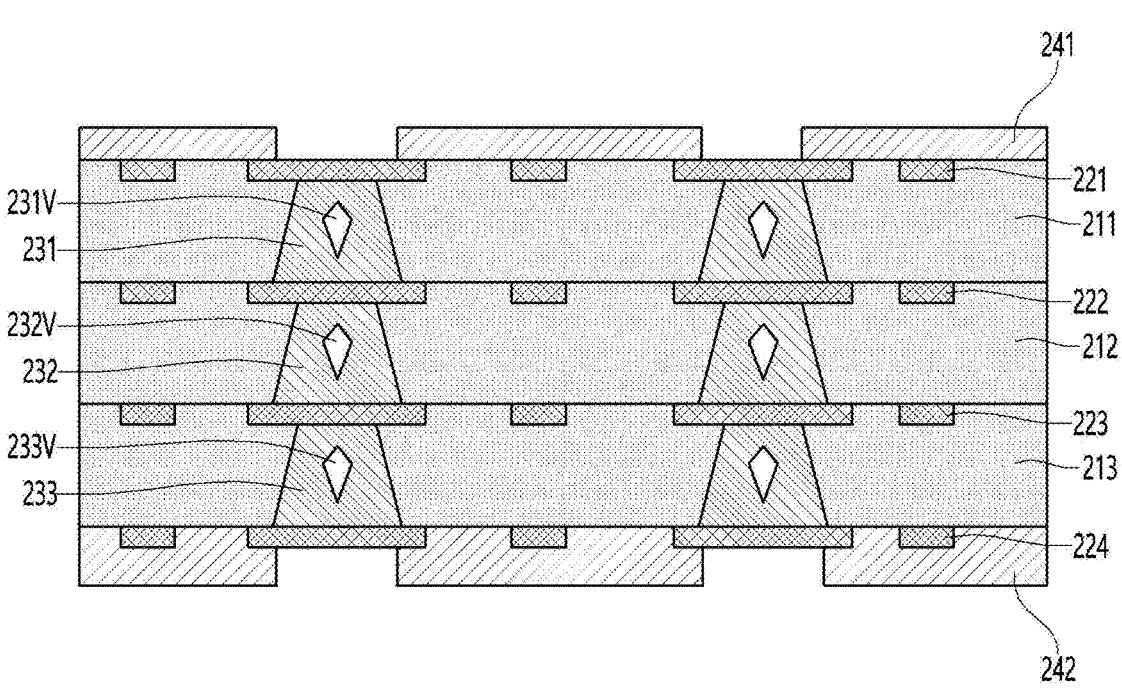

FIGS. 7A and 7I are views showing a method of manufacturing the circuit board shown in FIG. 5 in order of processes.

Referring to FIG. 7A, in the embodiment, a carrier board that is the basis for manufacturing a circuit board is prepared. The carrier board may be a basic material for manufacturing a circuit board using the ETS method.

For example, the embodiment may prepare a carrier board in which a carrier insulating layer (CB1) and a metal layer (CB2) are disposed on at least one surface of the carrier insulating layer (CB1). At this time, the metal layer CB2 may be disposed on only one of the first and second surfaces of the carrier insulating layer CB1, or may be disposed on both surfaces. For example, the metal layer (CB2) is disposed only on one surface of the carrier insulating layer (CB1), and accordingly, the ETS process for manufacturing a circuit board can be performed only on the one surface. Alternatively, the metal layer CB2 may be disposed on both surfaces of the carrier insulating layer CB1, and thus an ETS process for manufacturing a circuit board can be performed simultaneously on both surfaces of the carrier board. In this case, two circuit boards can be manufactured at once.

The metal layer (CB2) may be formed by electroless plating on the carrier insulating layer (CB1). Alternatively, the carrier insulating layer (CB2) and the metal layer (CB2) may be CCL (Copper Clad Laminate).

In addition, the embodiment may further form a plating layer (not shown) on the metal layer CB2, which is a separation layer for easy separation of the substrate and the carrier board and a seed layer used when forming a circuit board. The plating layer (not shown) may be formed on the metal layer 520 through electroless plating, or alternatively, it may be formed through a sputtering process.

Next, in the embodiment, a first dry film 410 is formed on the lower surface of the metal layer (CB2). At this time, the first dry film 410 may include an open region. For example, the first dry film 410 may include an open region on the lower surface of the metal layer CB2 that overlaps in the vertical direction with a region where the first circuit pattern layer 221 will be formed.

Next, as shown in FIG. 7B, the embodiment proceeds with electrolytic plating using the metal layer (CB2) as a seed layer to form a first circuit pattern layer 221 that fills the open region of the first dry film 410. Then, when the first circuit pattern layer 221 is formed, the embodiment can proceed with a process of removing the first dry film 410.

Next, as shown in FIG. 7C, a first insulating layer 211 covering the first circuit pattern layer 221 is formed on the lower surface of the plating layer CB2. At this time, the first insulating layer 211 may have a thickness of 80 um or more.

Next, as shown in FIG. 7D, in the embodiment, a through hole VH is formed that passes through the first insulating layer 211. The through hole (VH) may be formed through a laser process. The through hole VH may vertically overlap at least one of the first circuit pattern layers 221. At this time, the through hole (VH) may have a first inclination whose width gradually decreases toward the metal layer (CB2).

Next, as shown in FIG. 7E, the embodiment proceeds with a process of filling the through hole (VH) with a conductive material. Accordingly, the embodiment allows a first through electrode 231 and a second circuit pattern layer 222 including a pad part connected to the first through electrode 231 on the lower surface of the first insulating layer 211 to be formed. At this time, the first through electrode 231 may include a first void portion 231V.

Next, as shown in FIG. 7F, in the embodiment, a second insulating layer 212 is formed on the lower surface of the first insulating layer 211. Hereafter, the embodiment allows a second through electrode 232 penetrating the second insulating layer 212 and a third circuit pattern layer 223 including a pad part connected to the second through electrode 232 on the lower surface of the second insulating layer 212 to be formed. At this time, the second through electrode 232 may include a second void portion 232V.

Next, as shown in FIG. 7G, in the embodiment, a third insulating layer 213 is formed on the lower surface of the second insulating layer 212. Hereafter, the embodiment allows a third through electrode 233 penetrating the third insulating layer 213 and a fourth circuit pattern layer 224 including a pad part connected to the third through electrode 233 on the lower surface of the third insulating layer 213 to be formed. At this time, the third through electrode 233 may include a third void portion 233V.

Next, as shown in FIG. 7H, the embodiment may proceed with a process of removing the carrier insulating layer (CB1) and the metal layer (CB2).

Next, as shown in FIG. 7I, the embodiment may proceed with a process of forming a first protective layer 241 on the upper surface of the first insulating layer 211 and a process of forming a second protective layer 242 on the lower surface of the third insulating layer 213.

The circuit board of the embodiment includes an insulating layer and a through electrode passing through the insulating layer. At this time, the through electrode includes a void portion, which is an empty space not filled with a conductive material. Additionally, the embodiment includes a first pad part disposed on the upper surface of the through electrode. At this time, a thickness of the through electrode may exceed 80 um, and the upper surface of the first pad part may be a flat surface that does not include a concave portion. That is, in the comparative example, a thickness of the through electrode is above a certain level, and accordingly, a concave portion concave downward is provided at an upper surface of the first pad part. In contrast, the embodiment includes a void portion in the through electrode, thereby eliminating the concave portion formed at the first pad part. Accordingly, the embodiment can maintain the flatness of the circuit board and thereby improve the electrical reliability and physical reliability of the circuit board. Additionally, the embodiment can omit an additional plating process and polishing process performed to remove the concave portion, thereby simplifying a process of manufacturing.

Meanwhile, the void portion within the through electrode of the embodiment may include a first region having a second inclination different from the first inclination of the through electrode. At this time, the second inclination may be different from the first inclination only in an angle of inclination, but a direction of inclination may be the same. In addition, the embodiment allows improving the elasticity of the through electrode and the elasticity of the circuit board through the first region of the void portion having the second inclination in the same inclined direction as the first inclination, as a result, the embodiment can absorb damage from thermal shock. Accordingly, the embodiment can inhibit cracks that may occur due to damage that may occur in various usage environments, and thus improve the physical reliability of the circuit board.

Additionally, the void portion of the through electrode of the embodiment may include a second region having a third inclination different from the first inclination of the through electrode. At this time, the third inclination may be different from the first inclination in not only an angle of inclination but also a direction of inclination. In addition, the embodiment allows to improve the strength of the through electrode by using the second region of the void portion having a third inclination having a in inclination direction different from the first inclination, furthermore, the strength of the circuit board can be improved, and through this, warpage characteristics can be improved. That is, the inclined direction of the second region of the void portion with the third inclination is different from the inclined direction of the first inclination of the through electrode, and accordingly, it can function to support the through electrode, thereby improving the strength of the through electrode and the circuit board.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

What is claimed is:

1. A circuit board comprising:
an insulating layer including an upper and lower surface; and
a through electrode passing through the upper and lower surfaces of the insulating layer and having a first inclination whose width gradually decreases along a vertical direction from the upper surface of the insulating layer to the lower surface of the insulating layer, and
wherein the through electrode includes a void portion having an inclination different from the first inclination, and
wherein the void portion includes an overlap region that overlaps the first inclination along a horizontal direction and whose width gradually increases along the vertical direction.

2. The circuit board of claim 1, wherein a vertical cross-sectional shape of the void portion is a diamond shape.

3. The circuit board of claim 2, wherein the void portion includes:
a first region adjacent to a lower surface of the through electrode and having a second inclination whose width gradually decreases along the vertical direction; and
a second region adjacent to the upper surface of the through electrode and having a third inclination whose width gradually increases along the vertical direction, wherein the overlap region corresponds to the second region.

4. The circuit board of claim 3, wherein a vertical distance of the second region of the void portion is greater than a vertical distance of the first region of the void portion.

5. The circuit board of claim 3, wherein the second inclination of the first region of the void portion and the first inclination of the through electrode are inclined in a same direction.

6. The circuit board of claim 3, wherein the third inclination of the second region of the void portion and the first inclination of the through electrode are inclined in different directions.

7. The circuit board of claim 3, wherein a vertical distance from a lowermost end of the first region of the void portion to an uppermost end of the second region satisfies a range of 20% to 80% of a thickness of the through electrode.

8. The circuit board of claim 3, wherein a width in a widest region of the void portion satisfies a range of 30% to 80% of a width of a lower surface of the through electrode.

9. The circuit board of claim 3, wherein the first region of the void portion includes a first side surface in a vertical cross-section in a vertical direction toward the upper and lower surfaces of the through electrode, wherein the second region of the void portion includes a second side surface connected to the first side surface in a vertical cross-section, wherein the second inclination is a straight inclination connecting one end and an other end of the first side surface, and wherein the third inclination is a straight inclination connecting one end and an other end of the second side surface.

10. The circuit board of claim 9, wherein at least one of the first side surface and the second side surface has a straight line shape having the second inclination or the third inclination.

11. The circuit board of claim 9, wherein at least one of the first side surface and the second side surface has a curved surface with a certain curvature in a thickness direction of the void portion, and wherein the curved surface includes at least one of a curved surface convex toward an outside of the void portion and a curved surface concave toward an inside of the void portion.

12. The circuit board of claim 9, wherein at least one of the first side surface and the second side surface in a first vertical cross section of the void portion has a first shape of any one of a straight line having the second inclination or the third inclination, a curved surface convex toward an outside of the void portion, and a curved surfaces concave toward an inside of the void portion, and wherein at least one of the first side surface and the second side surface in a second vertical cross section different from the first vertical cross section has a second shape different from the first shape among a straight line having the second inclination or the third inclination, a curved surface convex toward the outside of the void portion, and a curved surface concave toward the inside of the void portion.

13. The circuit board of claim 1, wherein a vertical cross-sectional shape of the void portion is a triangular shape.

14. The circuit board of claim 13, wherein the void portion has a third inclination whose width gradually increases along the vertical direction.

15. The circuit board of claim 14, wherein the third inclination of the void portion and the first inclination of the through electrode are inclined in different directions.

16. The circuit board of claim 1, comprising:
a pad part disposed on the insulating layer, and
wherein an upper surface of the first pad part is flat.

17. A semiconductor package comprising:
an insulating layer including an upper and lower surface;
a through electrode passing through the upper and lower surfaces of the insulating layer and having a first inclination whose width gradually decreases toward the lower surface of the insulating layer;
a first pad part disposed on the upper surface of the insulating layer and connected to an upper surface of the through electrode;
a second pad part disposed on the lower surface of the insulating layer and connected to a lower surface of the through electrode; and
a semiconductor device disposed on the first pad part,
wherein the through electrode includes a void portion having an inclination different from the first inclination, and
wherein the void portion includes an overlap region that overlaps the first inclination along a horizontal direction and whose width gradually increases along the vertical direction.

18. The semiconductor package of claim 17, wherein the void portion includes:
a first region adjacent to a lower surface of the through electrode and having a second inclination whose width gradually decreases along the vertical direction; and
a second region adjacent to the upper surface of the through electrode and having a third inclination whose width gradually increases along the vertical direction,
wherein the overlap region corresponds to the second region.

19. The semiconductor package of claim 18, wherein a vertical distance of the second region of the void portion is greater than a vertical distance of the first region of the void portion, and
wherein the second inclination of the first region of the void portion and the first inclination of the through electrode are inclined in a same direction, and the third inclination of the second region and the first inclination of the through electrode are inclined in different directions.

20. The semiconductor package of claim 17, wherein the void portion has a third inclination whose width gradually increases along the vertical direction, and
wherein the third inclination of the void portion and the first inclination of the through electrode are inclined in different directions.

* * * * *